US012557513B2

(12) United States Patent
Lee et al.

(10) Patent No.: US 12,557,513 B2
(45) Date of Patent: Feb. 17, 2026

(54) DISPLAY APPARATUS

(71) Applicant: Samsung Display Co., Ltd., Yongin-si (KR)

(72) Inventors: Jaeun Lee, Yongin-si (KR); Joohee Jeon, Yongin-si (KR); Chungsock Choi, Yongin-si (KR); Hyungsuk Hwang, Yongin-si (KR); Gunhee Kim, Yongin-si (KR); Sunyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 546 days.

(21) Appl. No.: 17/983,306

(22) Filed: Nov. 8, 2022

(65) Prior Publication Data
US 2023/0165100 A1    May 25, 2023

(30) Foreign Application Priority Data
Nov. 19, 2021   (KR) .......................... 10-2021-0160706

(51) Int. Cl.
*H10K 59/35*    (2023.01)
*H10K 59/131*    (2023.01)

(52) U.S. Cl.
CPC ......... *H10K 59/353* (2023.02); *H10K 59/131* (2023.02); *H10K 59/352* (2023.02)

(58) Field of Classification Search
None
See application file for complete search history.

(56) References Cited

U.S. PATENT DOCUMENTS

| | | | |
|---|---|---|---|
| 9,880,394 B2 * | 1/2018 | Takama | G02B 30/27 |
| 11,061,295 B2 * | 7/2021 | Bang | G02F 1/1368 |
| 11,114,507 B2 * | 9/2021 | Wang | C23C 14/24 |
| 12,114,553 B2 | 10/2024 | Yun et al. | |
| 2019/0373166 A1 * | 12/2019 | Jia | G09G 3/2003 |
| 2021/0020664 A1 * | 1/2021 | Tan | G09G 3/20 |
| 2021/0327967 A1 | 10/2021 | Zhang et al. | |
| 2021/0408111 A1 * | 12/2021 | Lou | H10H 20/857 |
| 2022/0208870 A1 | 6/2022 | Choi et al. | |

FOREIGN PATENT DOCUMENTS

| | | |
|---|---|---|
| CN | 110648620 A | 1/2020 |
| CN | 210120138 U | 2/2020 |
| KR | 10-2020-0050059 A | 5/2020 |
| KR | 10-2021-0107215 A | 9/2021 |

* cited by examiner

*Primary Examiner* — Bilkis Jahan
(74) *Attorney, Agent, or Firm* — Womble Bond Dickinson (US) LLP

(57) ABSTRACT

A display apparatus includes a substrate including a first area and a second area, auxiliary pixels in the first area, and including first auxiliary pixels, respective ones of which being along a first line, and second auxiliary pixels, respective ones of which being arranged along a second line that is parallel to the first line, and third auxiliary pixels, respective ones of which being arranged along a third line that is parallel to the first line, and having a same pixel arrangement as the second auxiliary pixels, main pixels in the second area, and a transmissive portion between the auxiliary pixels, wherein a first distance between the first line and the second line at one side of the first line is less than a second distance between the first line and the third line at an other side of the first line.

19 Claims, 16 Drawing Sheets

DISPLAY APPARATUS

CROSS-REFERENCE TO RELATED APPLICATION

This application claims priority to, and the benefit of, Korean Patent Application No. 10-2021-0160706, filed on Nov. 19, 2021, in the Korean Intellectual Property Office, the disclosure of which is incorporated by reference herein in its entirety.

BACKGROUND

1. Field

One or more embodiments relate to display apparatuses having an extended display area to display an image even in an area where components that are electronic elements are arranged.

2. Description of the Related Art

Recently, uses of display apparatuses have been diversified. Furthermore, as the thickness and the weight of a display apparatus decrease, the scope of a use thereof has expanded.

As display apparatuses are variously used, there may be various methods to design the shape of a display apparatus. Also, the number of functions to be grafted or linked to display apparatuses have increased.

SUMMARY

One or more embodiments include display apparatuses having an extended display area to display an image even in an area where components including electronic elements are arranged. However, such an aspect is merely an example, and the scope of the present disclosure is not limited thereby.

Additional aspects will be set forth in part in the description that follows and, in part, will be apparent from the description, or may be learned by practice of the presented embodiments of the disclosure.

According to an aspect of the disclosure, a display apparatus includes a substrate including a first area and a second area, auxiliary pixels in the first area, and including first auxiliary pixels, respective ones of which being along a first line, and second auxiliary pixels, respective ones of which being arranged along a second line that is parallel to the first line, and third auxiliary pixels, respective ones of which being arranged along a third line that is parallel to the first line, and having a same pixel arrangement as the second auxiliary pixels, main pixels in the second area, and a transmissive portion between the auxiliary pixels, wherein a first distance between the first line and the second line at one side of the first line is less than a second distance between the first line and the third line at an other side of the first line.

Per unit area, a luminance of the first auxiliary pixels may be greater than a luminance of the second auxiliary pixels or the third auxiliary pixels.

The first auxiliary pixels may include second sub-pixels for emitting green light.

The second auxiliary pixels and the third auxiliary pixels may include first sub-pixels for emitting red light and third sub-pixels for emitting blue light.

The first area may be in contact with the second area, and may include a first boundary portion and a second boundary portion that are substantially symmetrical and substantially parallel to each other, wherein a first interval between corresponding ones of the main pixels and corresponding ones of the second auxiliary pixels that are closest to the first boundary portion is different from a second interval between corresponding ones of the main pixels and corresponding ones of the first auxiliary pixels that are closest to the second boundary portion.

The first interval may be greater than the second interval.

The display apparatus may further include a component corresponding to the first area.

The transmissive portion may be between sub-pixels that are configured to emit light of a same wavelength among the auxiliary pixels.

Intervals in a first direction between sub-pixels that are configured to emit light of a same wavelength among the auxiliary pixels may be substantially equal.

According to another aspect of the disclosure, a display apparatus includes a substrate including a first area and a second area, auxiliary pixels in the first area, main pixels in the second area, a transmissive portion between the auxiliary pixels, and a first boundary portion and a second boundary portion, which are substantially symmetrical and substantially parallel to each other, as respective boundary portions contacting the first area and the second area, wherein a first interval between respective ones of the main pixels and respective ones of auxiliary pixels that are closest to the first boundary portion is different from a second interval between others of the main pixels and others of the auxiliary pixels that are closest to the second boundary portion.

The auxiliary pixels may be in n rows and m columns, and are entirely shifted in the second area in a first direction from a first row toward an n-th row, and/or in a second direction from a first column toward an m-th column.

A distance in which the auxiliary pixels are shifted in the first direction may be different from a distance in which the auxiliary pixels are shifted in the second direction.

The auxiliary pixels may include first auxiliary pixels in the first row and second auxiliary pixels in the n-th row, wherein the first auxiliary pixels and the second auxiliary pixels are configured to emit light of different wavelengths.

The first auxiliary pixels may be configured to emit green light, and the second auxiliary pixels may be configured to emit blue or red light.

The first interval may be greater than the second interval.

The display apparatus may further include a component corresponding to the first area.

According to another aspect of the disclosure, a display apparatus includes a substrate including a first area and a second area, auxiliary pixels in the first area and including first sub-pixels, second sub-pixels, and third sub-pixels, the first sub-pixels, the second sub-pixels, and the third sub-pixels configured to respectively emit light of different wavelengths, main pixels in the second area, a transmissive portion between the auxiliary pixels, and a first boundary portion and a second boundary portion that are substantially symmetrical and substantially parallel to each other, and contacting the first area and the second area, wherein, per unit area, a luminance of the second sub-pixels is greater than a luminance of the first sub-pixels and the third sub-pixels, and wherein, in the first area, the first sub-pixels are shifted in a first direction from the second boundary portion to the first boundary portion.

The first sub-pixels and the second sub-pixels may be alternately arranged in the second boundary portion, wherein the second sub-pixels and the third sub-pixels are alternately arranged in the first boundary portion.

The second sub-pixels may be configured to emit green light.

The first sub-pixels may be configured to emit red light, and the third sub-pixels may be configured emit blue light.

The display apparatus may further include a component corresponding to the first area.

An arrangement of respective ones of the main pixels closest to the first boundary portion may be the same as an arrangement of respective ones of the auxiliary pixels closest to the second boundary portion.

The respective ones of the main pixels closest to the first boundary portion and the respective ones of the auxiliary pixels closest to the second boundary portion may be configured to emit light of a same color.

The first area may include a third boundary portion and a fourth boundary portion in contact with the second area, and substantially symmetrical and substantially parallel to each other in a second direction crossing the first direction, wherein an arrangement of corresponding ones of the main pixels closest to the third boundary portion is the same as an arrangement of corresponding ones of the auxiliary pixels closest to the fourth boundary portion.

The corresponding ones of the main pixels closest to the third boundary portion and the corresponding ones of the auxiliary pixels closest to the fourth boundary portion may be configured to emit light of a same color.

Aspects other than those described above will become apparent from the following drawings, claims, and detailed description of the disclosure

BRIEF DESCRIPTION OF THE DRAWINGS

The above and other aspects of certain embodiments of the disclosure will be more apparent from the following description taken in conjunction with the accompanying drawings, in which.

DETAILED DESCRIPTION

Figure 1:
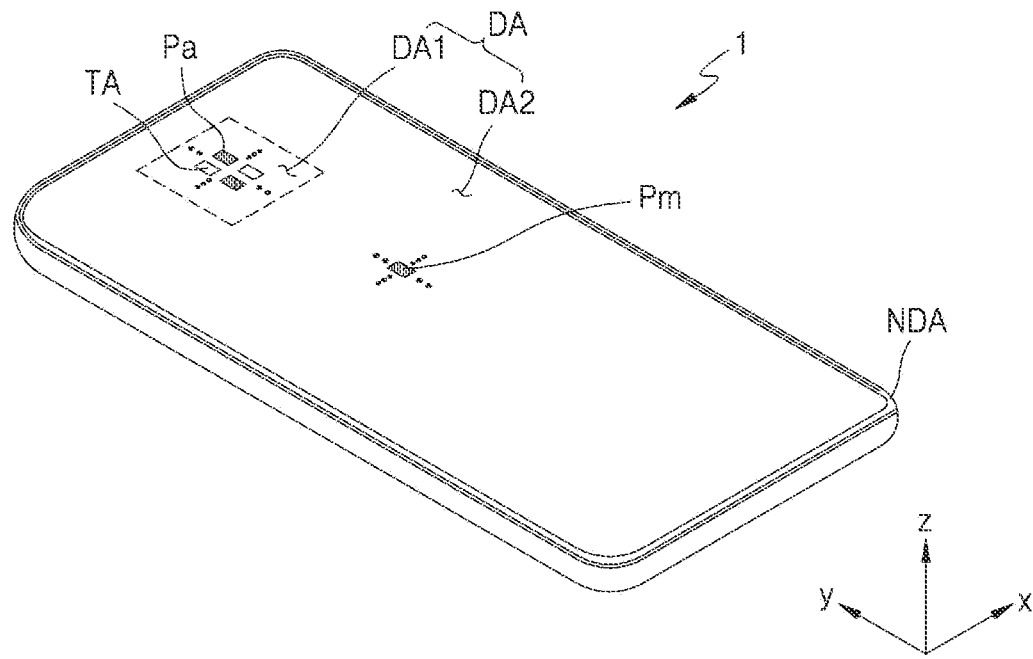
FIG. 1 is a schematic perspective view of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the specification, it will be understood that when a layer, region, or component is referred to as being "formed on" another layer, region, or component, it can be directly or indirectly formed on the other layer, region, or component. That is, for example, intervening layers, regions, or components may be present.

In the specification, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the expression such as "A and/or B" may include A, B, or A and B. Furthermore, the expression such as "at least one of A and B" may include A, B, or A and B.

In the specification, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, when a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, since sizes and thicknesses of components in the drawings are arbitrarily illustrated for convenience of explanation, the following embodiments are not limited thereto.

FIG. 1 is a schematic perspective view of a display apparatus 1 according to one or more embodiments.

Referring to FIG. 1, the display apparatus 1 may include a display area DA, and a peripheral area NDA outside the display area DA. The display area DA may include a first area DA1 that is a component area, and a second area DA2 that is a main display area at least partially surrounding the first area DA1. The first area DA1 displays an auxiliary image, and the second area DA2 displays a main image. The first area DA1 and the second area DA2 may individually display different images, or may display an image together. The peripheral area NDA may be a kind of a non-display area where no display element is arranged. The display area DA may be entirely surrounded by the peripheral area NDA.

The second area DA2 may be located to surround at least part of a singular first area DA1. As an example, FIG. 1 illustrates that the second area DA2 entirely surrounds the singular first area DA1. In one or more other embodiments, the display apparatus 1 may have two or more first areas DA1, and the shape and size of a plurality of first areas DA1 may be different from each other. When viewed from a direction approximately perpendicular to an upper surface of the display apparatus 1, the first area DA1 may have various shapes, such as a circle, an oval, a polygon, such as a rectangle and the like, a star, a diamond, etc.

FIG. 1 illustrates that, when viewed from a direction approximately perpendicular to the upper surface of the display apparatus 1, the first area DA1 is located at the upper center of, or generally above the center of, the second area DA2 having an approximately rectangular shape. However, in some embodiments, the first area DA1 may be located at one side, for example, at the upper right side or the upper left side, of the second area DA2 having a rectangular shape. For example, the first area DA1 having a circular shape may be located in the second area DA2, or the first area DA1 having a rectangular bar shape may be located at one side of the second area DA2.

The display apparatus 1 may provide an image by using a plurality of main sub-pixels Pm arranged in the second area DA2, and a plurality of auxiliary sub-pixels Pa arranged in the first area DA1.

In the first area DA1, a component 20 that is an electronic element may be arranged under a display panel corresponding to the first area DA1, as described below with reference to FIG. 4 or 6.

Figure 4:
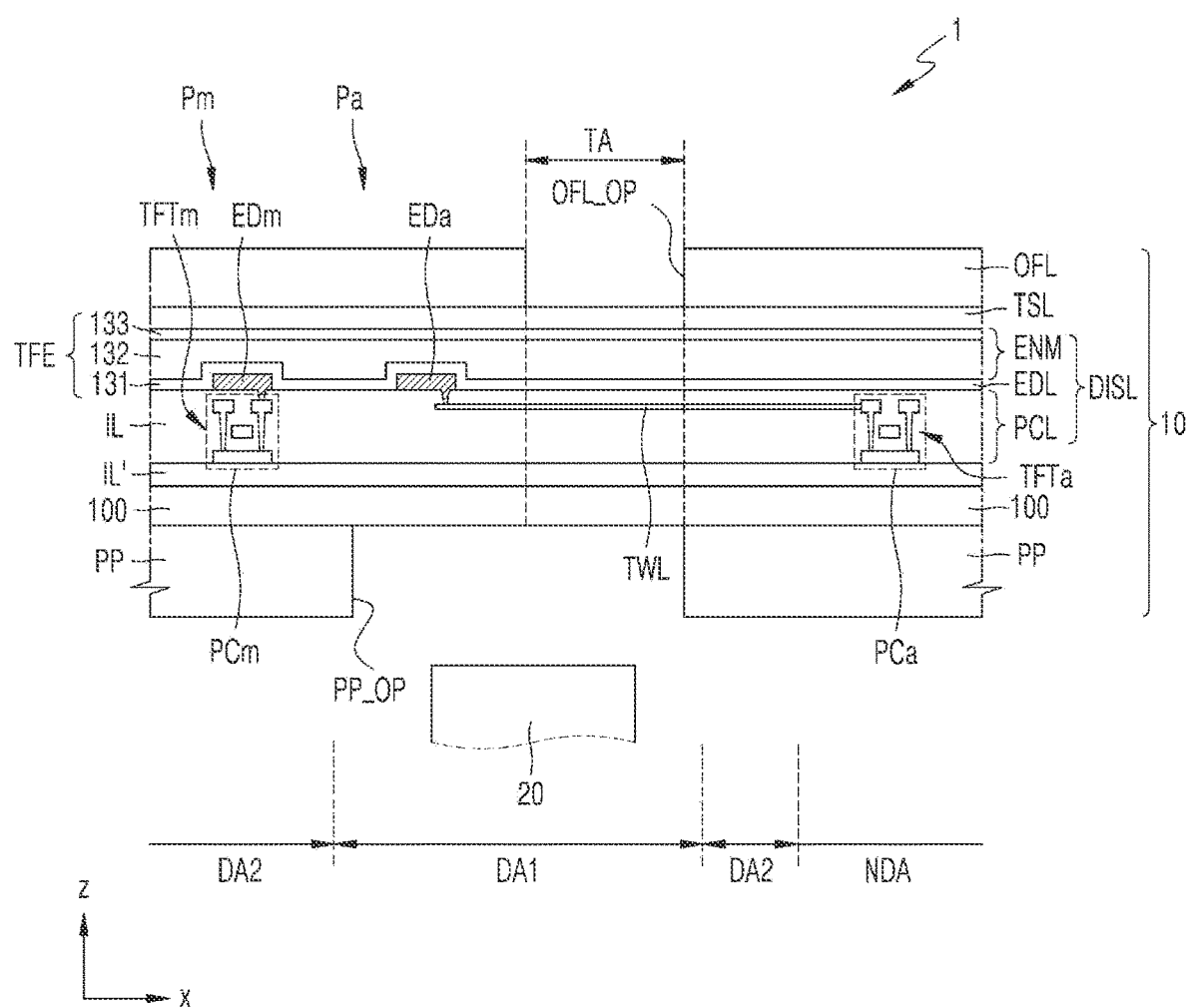
FIG. 4 is a schematic cross-sectional view showing part of a display apparatus according to one or more embodiments.
Figure 6:
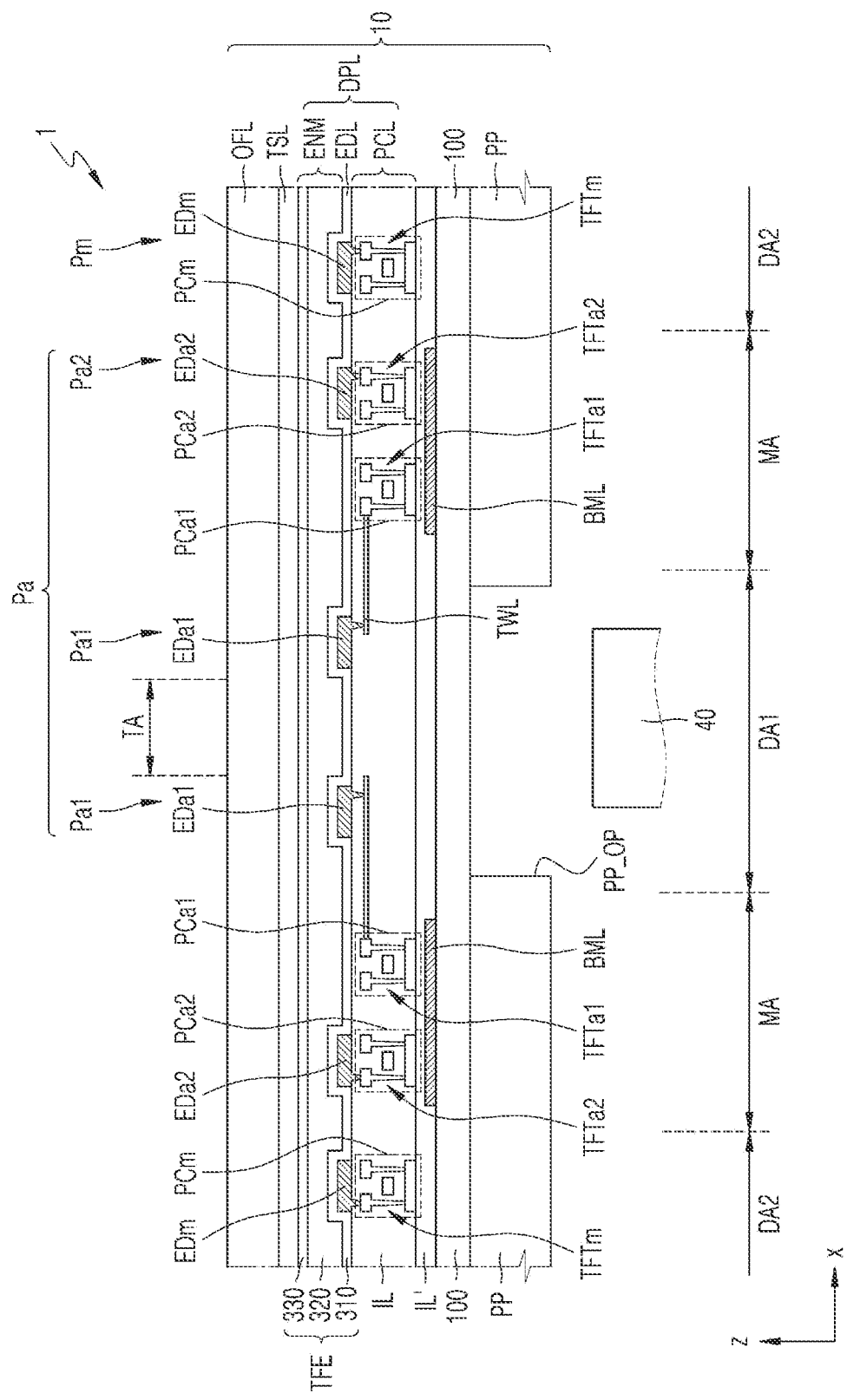
FIG. 6 is a schematic cross-sectional view showing part of a display apparatus according to one or more other embodiments.

Referring to FIG. 4 or 6, the component 20 may be an electronic element that uses light or sound. For example, the electronic element may include a sensor for measuring a distance, for example, a proximity sensor, a sensor for recognizing part of the body of a user, for example, a fingerprint, an iris, a face, and the like, a compact lamp for outputting light, an image sensor for capturing an image, for example, a camera, and the like. An electronic element using light may use light in various wavelength ranges, for example, visible light, infrared light, ultraviolet light, and the like. An electronic element using sound may uses ultrasound or sound of a different frequency range. In some embodiments, the component 20 may include sub-components, such as a light-emitting portion and a light-receiving portion together. The light-emitting portion and the light-receiving portion may have an integrated structure or a physically separated structure, and a pair of the light-emitting portion and the light-receiving portion may constitute a singular component 20. To reduce a limitation on the function of the component 20, the first area DA1 may include a transmissive area TA through which light or/and sound and the like that is output from the component 20 to the outside or proceeds from the outside to the component 20 may transmit.

In a display panel according to one or more embodiments and a display apparatus including the display panel, when light transmits through the first area DA1, light transmittance maybe about 10% or more, for example, about 40% or more, about 25% or more, about 50% or more, about 85% or more, or about 90% or more.

A plurality of auxiliary sub-pixels Pa may be arranged in the first area DA1. The auxiliary sub-pixels Pa may emit light to provide a certain image. An image displayed in the first area DA1 is an auxiliary image, and may have a resolution that is less than that of an image displayed in the second area DA2. In other words, the first area DA1 includes the transmissive area TA through which light and sound may transmit, and when no sub-pixel is arranged in the transmissive area TA, the number of the auxiliary sub-pixels Pa to be arranged per unit area in the first area DA1 may be less than the number of the main sub-pixels Pm to be arranged per unit area in the second area DA2.

In the following description, an organic light-emitting display apparatus is described as an example of the display apparatus 1 according to one or more embodiments, but the disclosure is not limited thereto. In one or more other embodiments, the display apparatus 1 may include display an apparatus such as an inorganic light-emitting display apparatus, an inorganic EL display apparatus, or a quantum dot light-emitting display apparatus. For example, an emission layer of a display element provided in the display apparatus 1 may include an organic material, an inorganic material, a quantum dot, an organic material and a quantum dot, or an inorganic material and a quantum dot.

Figure 2:
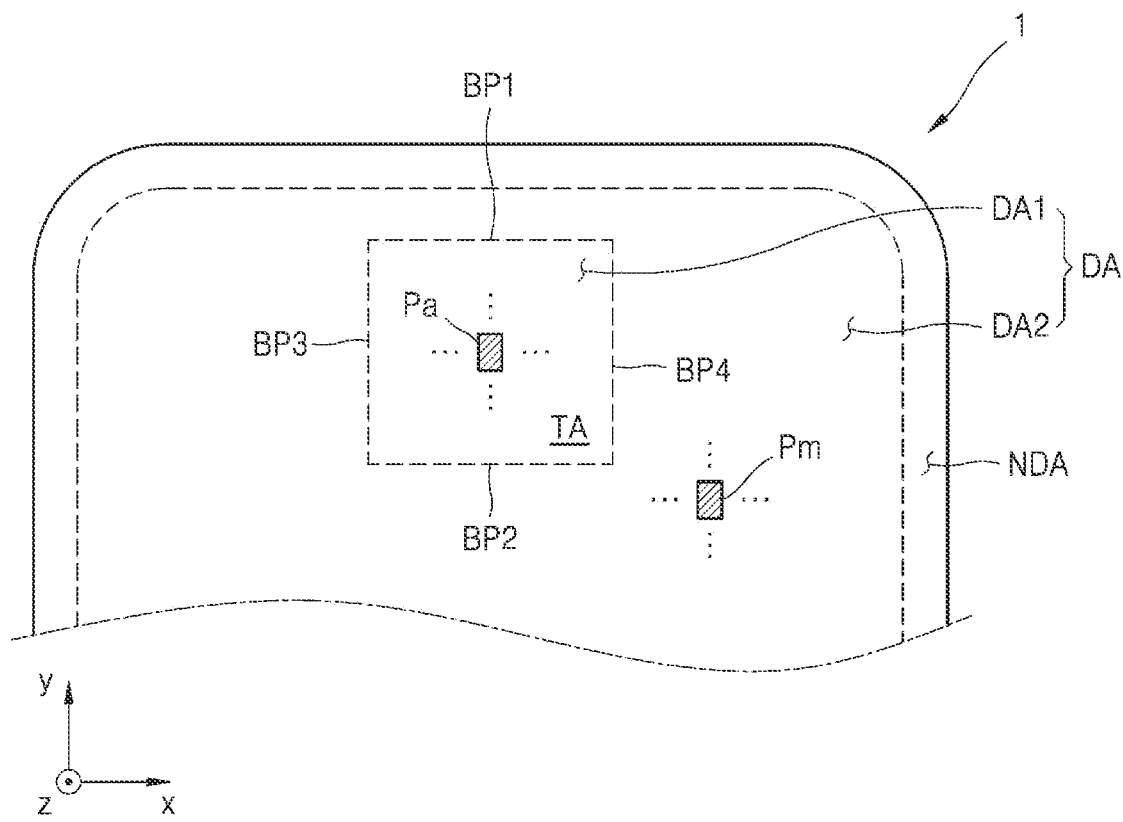
FIG. 2 is a plan view of part of a display area, according to one or more embodiments.
Figure 3:
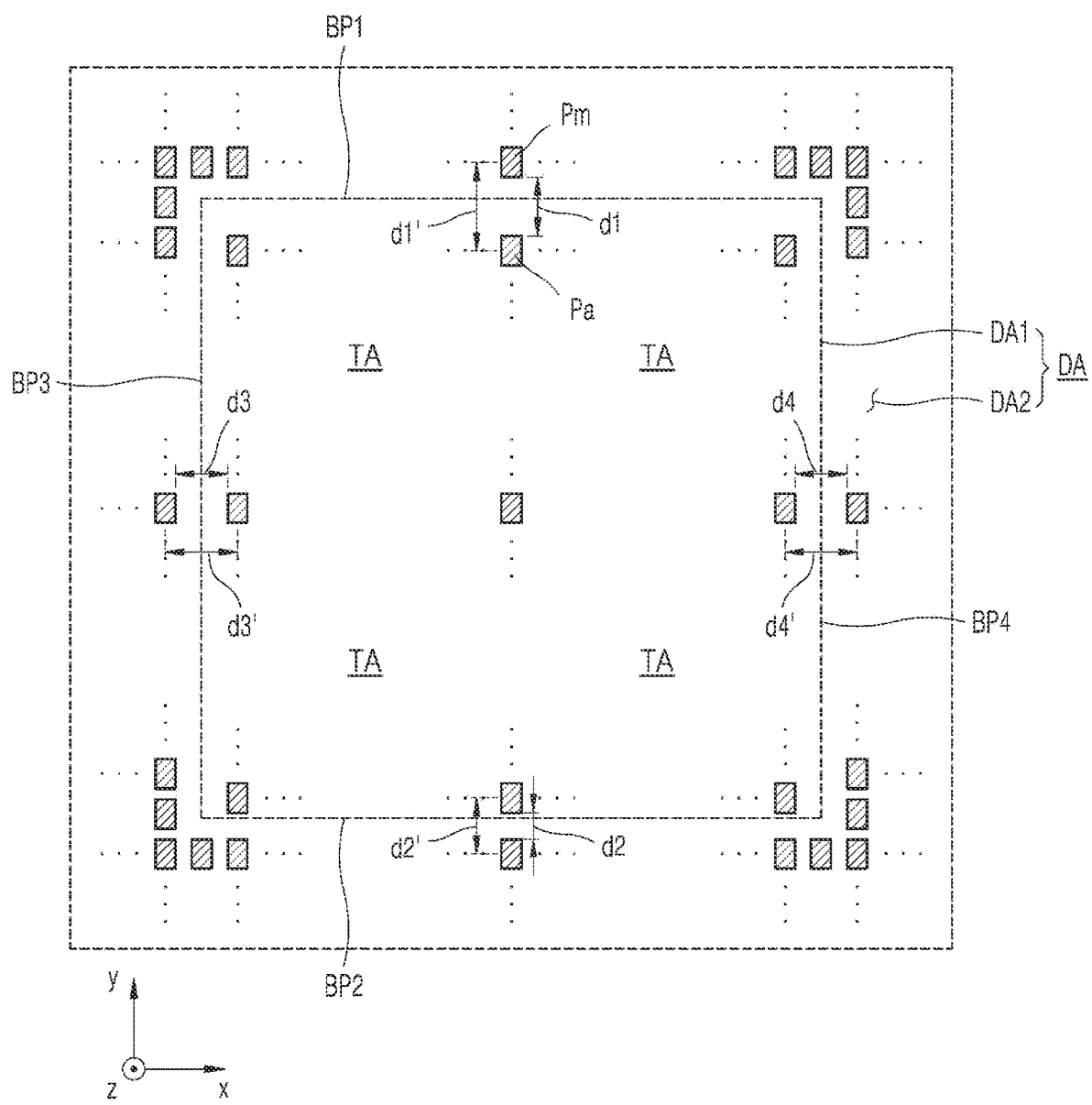
FIG. 3 is an enlarged plan view of a component area and a main display area therearound of the display area of FIG. 2.

FIG. 2 is a plan view showing part of the display area DA, according to one or more embodiments. FIG. 3 is an enlarged plan view of the component area and the main display area therearound of the display area DA of FIG. 2.

Referring to FIG. 2, the first area DA1 is provided as an approximate rectangle, and four sides thereof may be in contact with the second area DA2. In FIG. 2, the first area DA1 and the second area DA2 may be in contact with each other in a first boundary portion BP1, a second boundary portion BP2, a third boundary portion BP3, and a fourth boundary portion BP4. In this state, the first boundary portion BP1 and the second boundary portion BP2, and the third boundary portion BP3 and the fourth boundary portion BP4, may be respectively provided symmetrically to each other. The first boundary portion BP1 and the second boundary portion BP2 may be provided parallel to each other in an x-axis direction, and the third boundary portion BP3 and the fourth boundary portion BP4 may be provided parallel to each other in a y-axis direction.

In the display apparatus 1 according to one or more embodiments, in the first to fourth boundary portions BP1, BP2, BP3, and BP4 that the first area DA1 and the second area DA2 contact, an interval between respective main sub-pixels Pm and auxiliary sub-pixels Pa arranged on at least one boundary portion may be greater than an interval between respective main sub-pixels Pm and auxiliary sub-pixels Pa arranged on another boundary portion that is symmetrical to the at least one boundary portion. The auxiliary sub-pixels Pa arranged corresponding to the first to fourth boundary portions BP1, BP2, BP3, and BP4 have a luminance difference. To reduce the luminance difference, the interval between the main sub-pixels Pm and the auxiliary sub-pixels Pa arranged on at least one boundary portion, and the interval between the main sub-pixels Pm and the auxiliary sub-pixels Pa arranged on another boundary portion that is symmetrical to the at least one boundary portion, are different from each other so that the luminance difference in an edge portion of the first area DA1 may be reduced.

In the present specification, the interval between respective main sub-pixels Pm and auxiliary sub-pixels Pa arranged on a boundary portion is based on the main sub-pixels Pm and the auxiliary sub-pixels Pa that are arranged closest to each other with respect to the boundary portion, and may substantially mean intervals d1, d2, d3, and d4 (see FIG. 3) between respective main sub-pixels Pm and auxiliary sub-pixels Pa, or intervals d1', d2', d3', and d4' (see FIG. 3) between the centers of respective main sub-pixels Pm and auxiliary sub-pixels Pa. Furthermore, in the case when the size or the respective shape of main sub-pixels Pm and auxiliary sub-pixels Pa arranged on a boundary portion are different from each other, the interval may mean an average interval therebetween.

In one or more embodiments, in the display apparatus 1 of FIG. 3, a first interval d1 between the main sub-pixels Pm and the auxiliary sub-pixels Pa arranged on the first boundary portion BP1 may be different from a second interval d2 between the main sub-pixels Pm and the auxiliary sub-pixels Pa arranged on the second boundary portion BP2 that is symmetrical to the first boundary portion BP1. For example, the first interval d1 may be greater than the second interval d2. In other words, the auxiliary sub-pixels Pa arranged in the first area DA1 may be entirely moved in a +y direction or a −y direction. In FIG. 3, a third interval d3 and a fourth interval d4 between the main sub-pixels Pm and the auxiliary sub-pixels Pa arranged on each of the third boundary portion BP3 and the fourth boundary portion BP4 provided symmetrically to each other are illustrated to be the same, but the disclosure is not limited thereto.

In one or more other embodiments, the third interval d3 between the main sub-pixels Pm and the auxiliary sub-pixels Pa arranged on the third boundary portion BP3 may be different from the fourth interval d4 between the main sub-pixels Pm and the auxiliary sub-pixels Pa arranged on the fourth boundary portion BP4 that is symmetrical to the third boundary portion BP3. In other words, the auxiliary sub-pixels Pa arranged in the first area DA1 may be entirely moved in a +x direction or a −x direction. In this case, the first interval d1 and the second interval d2 may be the same or different from each other.

Figure 5:
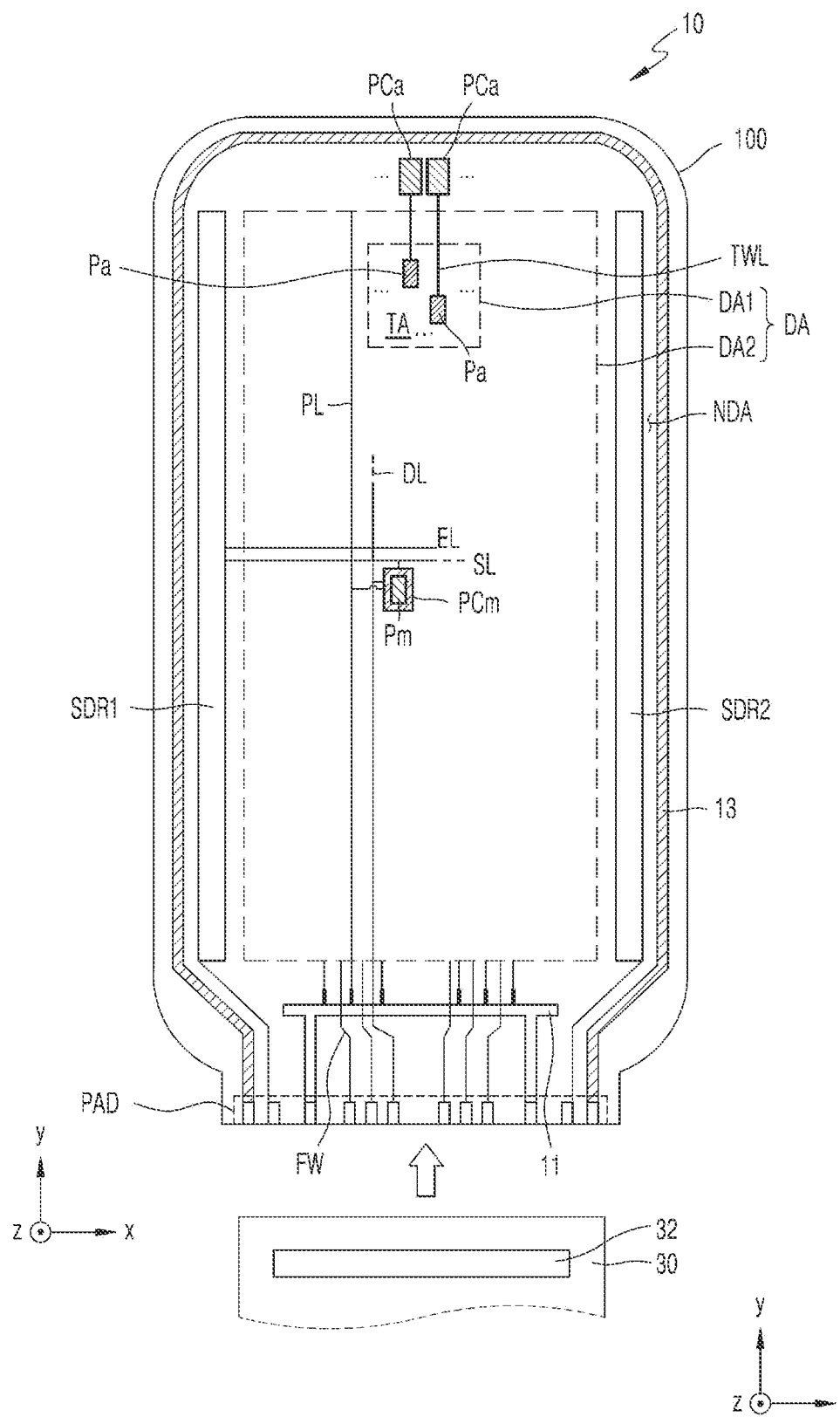
FIG. 5 is a schematic plan view of a display panel that may be included in the display apparatus of FIG. 4.

FIG. 4 is a schematic cross-sectional view showing part of the display apparatus 1 according to one or more embodiments. FIG. 5 is a schematic plan view of a display panel that may be included in the display apparatus 1 of FIG. 4.

Referring to FIG. 4, the display apparatus 1 may include a display panel 10 and the component 20 that overlaps the display panel 10. In some embodiments, a cover window for protecting the display panel 10 may be further provided above the display panel 10.

The display panel 10 may include a substrate 100, a display layer DISL on the substrate 100, a touchscreen layer TSL, an optical functional layer OFL, and a panel protection member PP below the substrate 100.

The display layer DISL may include a circuit layer PCL including thin film transistors TFTm and TFTa, a display element layer EDL including emission elements (EDm and EDa) that are display elements, and a sealing member ENM, such as a thin film encapsulation layer TFE or a sealing substrate. Insulating layers IL and IL' may be arranged between the substrate 100 and the display element layer EDL in the display layer DISL.

The substrate 100 may include an insulating material, such as glass, quartz, polymer resin, and the like. The substrate 100 may include a rigid substrate or a flexible substrate capable of bending, folding, rolling, and the like.

A main emission element EDm, and a main pixel circuit PCm connected to the main emission element EDm, may be arranged in the second area DA2 of the display panel 10. The main pixel circuit PCm may include at least one thin film transistor TFTm, and may control an operation of the main emission element EDm. The main sub-pixels Pm may be implemented through the light-emission of the main emission element EDm.

As an auxiliary emission element EDa is arranged in the first area DA1 of the display panel 10, the auxiliary sub-pixels Pa may be implemented. In one or more embodiments, an auxiliary pixel circuit PCa for driving the auxiliary emission element EDa may be arranged not in the first area DA1, but instead in the peripheral area NDA that is a non-display area. In one or more other embodiments, the auxiliary pixel circuit PCa may be arranged in various ways, for example, in part of the second area DA2, between the second area DA2 and the first area DA1, or the like. In other words, the auxiliary pixel circuit PCa may be arranged not to overlap the auxiliary emission element EDa.

The auxiliary pixel circuit PCa may include at least one thin film transistor TFTa, and may be electrically connected to the auxiliary emission element EDa via a connection wiring TWL. The connection wiring TWL may include a transparent conductive material. The auxiliary pixel circuit PCa may control an operation of the auxiliary emission element EDa. The auxiliary sub-pixels Pa may be implemented through the light-emission of the auxiliary emission element EDa.

An area of the first area DA1 where the auxiliary emission element EDa is not arranged may be defined as the transmissive area TA.

The transmissive area TA may be an area through which either light/signal emitted from the component 20 arranged corresponding to the first area DA1, or light/signal incident on the component 20, is transmitted. The transmissive area TA may be alternately arranged with the auxiliary emission element EDa (or, an area where a plurality of auxiliary emission elements EDa are arranged) in the first area DA1. The connection wiring TWL connecting the auxiliary pixel circuit PCa and the auxiliary emission element EDa may be arranged in the transmissive area TA. The connection wiring TWL may include a transparent conductive material having relatively high transmittance, and even when the connection wiring TWL is arranged in the transmissive area TA, the transmittance of the transmissive area TA may be secured. In one or more embodiments, as the auxiliary pixel circuit PCa is not arranged in the first area DA1, the area of the transmissive area TA may be easily expanded, and light transmittance may be improved.

The display element layer EDL may be covered by the thin film encapsulation layer TFE, or by the sealing substrate, as illustrated in FIG. 4. In one or more embodiments, the thin film encapsulation layer TFE may include at least one inorganic encapsulation layer and at least one organic encapsulation layer, as illustrated in FIG. 4. For example, the thin film encapsulation layer TFE may include first and second inorganic encapsulation layers 131 and 133, and an organic encapsulation layer 132 therebetween.

The first inorganic encapsulation layer 131, the organic encapsulation layer 132, and the second inorganic encapsulation layer 133 may be integrally formed to cover the second area DA2 and the first area DA1.

When the display element layer EDL is sealed by a sealing substrate, in some embodiments, the sealing substrate may face the substrate 100 with the display element layer EDL interposed therebetween. A gap may be present between the sealing substrate and the display element layer EDL. The sealing substrate may include glass. A sealant formed of frit and the like is arranged between the substrate 100 and the sealing substrate, and the sealant may be arranged in the above-described peripheral area NDA. The sealant arranged in the peripheral area NDA may surround the display area DA to reduce or prevent infiltration of moisture through a side surface.

The touchscreen layer TSL may acquire coordinates information according to an external input, for example, a touch event. The touchscreen layer TSL may include a touch electrode and touch wirings connected to the touch electrode. The touchscreen layer TSL may detect an external input by a self-capacitance method or a mutual capacitance method.

The touchscreen layer TSL may be formed on the thin film encapsulation layer TFE. Alternatively, the touchscreen layer TSL may be formed separately on a touch substrate and then may be coupled to the thin film encapsulation layer TFE through an adhesive layer, such as an optically clear adhesive (OCA). In one or more embodiments, the touchscreen layer TSL may be formed directly on the thin film encapsulation layer TFE, and in this case, the adhesive layer may not be arranged between the touchscreen layer TSL and the thin film encapsulation layer TFE.

The optical functional layer OFL may include an antireflective layer. The antireflective layer may reduce reflectivity of light (external light) input to the display apparatus 1 from the outside.

In one or more embodiments, the optical functional layer OFL may include a polarization film. The optical functional layer OFL may include an opening OFL_OP corresponding to the transmissive area TA. Accordingly, light transmittance of the transmissive area TA may be remarkably improved. The opening OFL_OP may be filled with a transparent material, such as light transparent resin (OCR, optically clear resin). In one or more other embodiments, the optical functional layer OFL may be provided as a filter plate including a black matrix and color filters.

The panel protection member PP may be attached on a lower surface of the substrate 100, and may support and protect the substrate 100. The panel protection member PP may include, or define, an opening PP_OP corresponding to the first area DA1. As the panel protection member PP includes/defines the opening PP_OP, the light transmittance of the first area DA1 may be improved. A panel protection member PP may include polyethylene terephthalate or polyimide.

The area of the first area DA1 may be greater than an area where the component 20 is arranged. Accordingly, the area of the opening PP_OP in the panel protection member PP may not match the area of the first area DA1. FIG. 4 illustrates that the component 20 is arranged at one side of the display panel 10 apart from the display panel 10, but at least part of the component 20 may be inserted in the opening PP_OP of the panel protection member PP.

Furthermore, a plurality of components 20 may be arranged in the first area DA1. The components 20 may have different functions. For example, the components 20 may include at least two of a camera (imaging device), a solar cell, a flash, a proximity sensor, an illuminance sensor, and an iris sensor.

FIG. 4 illustrates a case of one first area DA1, but a plurality of first areas DA1 may be provided as the first area DA1. In this case, the first areas DA1 may be arranged apart from each other. For example, while a first camera may be arranged corresponding to one of the first areas DA1, a second camera may be arranged corresponding to another of the first areas DA1. Alternatively, while a camera may be arranged corresponding to one of the first areas DA1, an infrared sensor may be arranged corresponding to another of the first areas DA1. The shapes and the sizes of the first areas DA1 may be different from each other.

Referring to FIG. 5, various constituent elements constituting the display panel 10 are arranged above the substrate 100.

The main sub-pixels Pm may be arranged in the second area DA2. Each of the main sub-pixels Pm may be implemented, as a light-emitting device, by a display element such as an organic light-emitting diode OLED. The main pixel circuit PCm for driving the main sub-pixels Pm may be arranged in the second area DA2, and the main pixel circuit PCm may be arranged to overlap the main sub-pixels Pm. Each of the main sub-pixels Pm may emit, for example, red, green, blue, or white light. The second area DA2 may be covered by the sealing member ENM to be protected from external air, moisture, or the like.

The first area DA1 may be located at one side of the second area DA2, or arranged inside the display area DA to be surrounded by the second area DA2, as described above. The auxiliary sub-pixels Pa are arranged in the first area DA1. Each of the auxiliary sub-pixels Pa may be implemented as a light-emitting device using a display element, such as the organic light-emitting diode OLED. Each of the auxiliary sub-pixels Pa may emit, for example, red, green, blue, or white light. The first area DA1 is covered by the sealing member ENM to be protected from external air, moisture, or the like.

The auxiliary pixel circuit PCa for driving the auxiliary sub-pixels Pa may be arranged in the peripheral area NDA adjacent to the first area DA1. For example, when the first area DA1 is arranged at an upper area of the display area DA, as illustrated in FIG. 5, the auxiliary pixel circuit PCa may be arranged in an upper side of the peripheral area NDA. The auxiliary pixel circuit PCa and the display element implementing the auxiliary sub-pixels Pa may be connected to each other by the connection wiring TWL extending in one direction, for example, the y direction.

The first area DA1 may have the transmissive area TA. The transmissive area TA may be arranged to surround the auxiliary sub-pixels Pa. Alternatively, the transmissive area TA may be arranged in the form of a lattice with the auxiliary sub-pixels Pa.

As the first area DA1 has the transmissive area TA, the resolution of the first area DA1 may be less than the resolution of the second area DA2. For example, the resolution of the first area DA1 may be about ½, about ⅜, about 1/3, about 1/4, about 2/9, about 1/8, about 1/9, about 1/16, etc. times the resolution of the second area DA2. For example, the resolution of the second area DA2 may be about 400 ppi or more, and the resolution of the first area DA1 may be about 200 ppi or about 100 ppi.

Each of the pixel circuits PCm and PCa for driving the sub-pixels Pm and Pa may be electrically connected to outer circuits arranged in the peripheral area NDA. A first scan driving circuit SDR1, a second scan driving circuit SDR2, a terminal portion PAD, a driving voltage supply line 11, and a common voltage supply line 13 may be arranged in the peripheral area NDA.

The first scan driving circuit SDR1 may apply, through a scan line SL, a scan signal to the main pixel circuit PCm for driving the main sub-pixels Pm. Furthermore, the first scan driving circuit SDR1 may apply a light-emitting control signal to each pixel circuit through a light-emitting control line EL. The second scan driving circuit SDR2 may be arranged symmetrical to the first scan driving circuit SDR1 with respect to the second area DA2. Some of the main pixel circuit PCm of the main sub-pixels Pm in the second area DA2 may be electrically connected to the first scan driving circuit SDR1, and the other may be electrically connected to the second scan driving circuit SDR2.

The terminal portion PAD may be arranged at one side of the substrate 100. The terminal portion PAD is not covered by insulating layers IL and IL' to be exposed and is connected to a display circuit board 30. A display driver 32 may be arranged above the display circuit board 30.

The display driver 32 may generate a control signal that is transmitted to the first scan driving circuit SDR1 and the second scan driving circuit SDR2. The display driver 32 may generate a data signal, and the generated data signal may be transmitted to the main pixel circuit PCm through a fan-out wiring FW, and a main data line DL/DLm connected to the fan-out wiring FW.

The display driver 32 may supply a driving voltage ELVDD through the driving voltage supply line 11, and a common voltage ELVSS through the common voltage supply line 13. The driving voltage ELVDD is applied to the pixel circuits PCm and PCa of the sub-pixels Pm and Pa through a driving voltage line PL connected to the driving voltage supply line 11, and the common voltage ELVSS may be applied to a counter electrode of the display element through the common voltage supply line 13.

The driving voltage supply line 11 may extend in the x direction under the second area DA2. The common voltage supply line 13 has a loop shape with one open side to partially surround the second area DA2.

Figure 7:
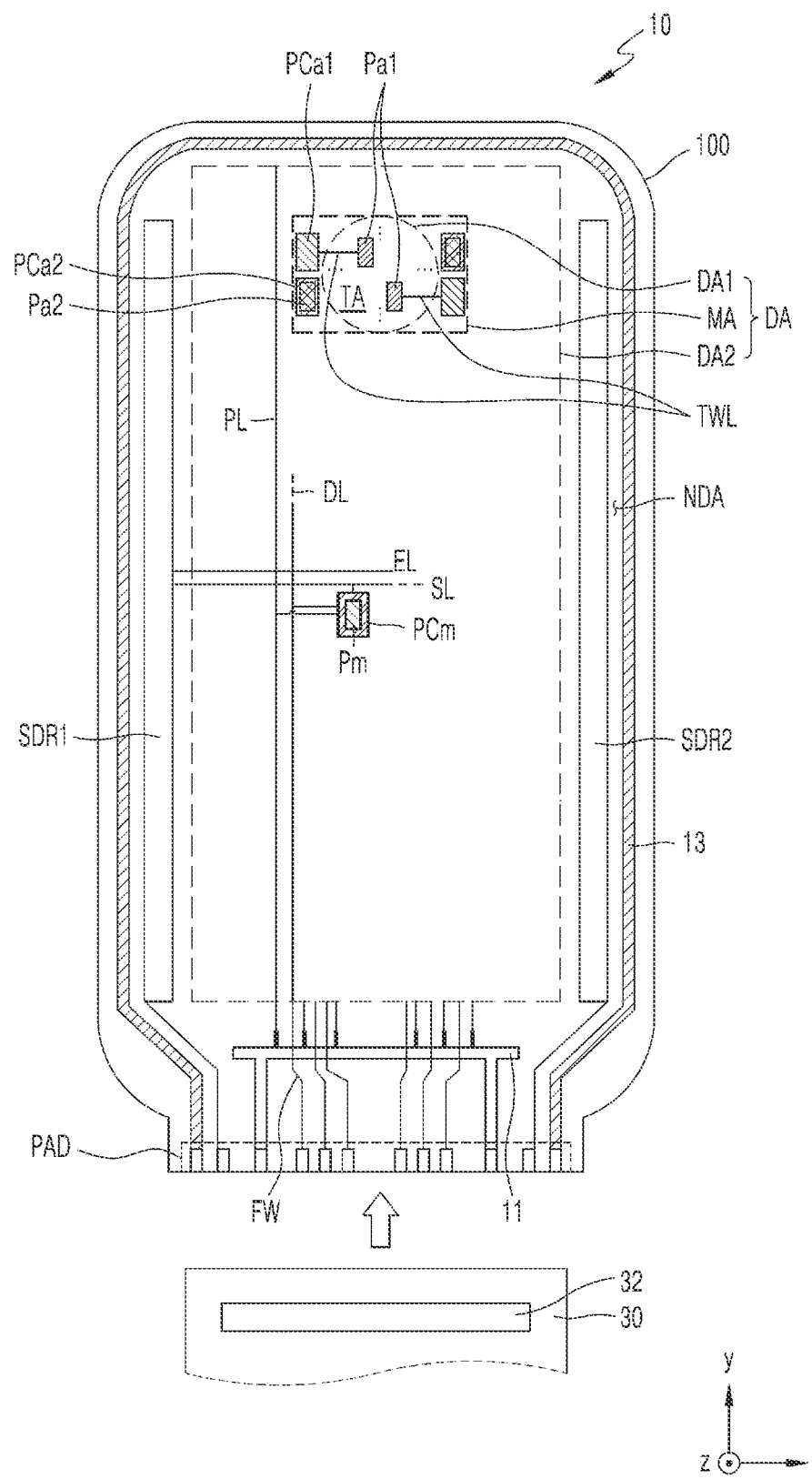
FIG. 7 is a schematic plan view of a display panel that may be included in the display apparatus of FIG. 6.

FIG. 6 is a schematic cross-sectional view showing part of a display apparatus according to one or more other embodiments. FIG. 7 is a schematic plan view of a display panel that may be included in the display apparatus of FIG. 6.

The display apparatus of FIGS. 6 and 7, there is a difference in that the auxiliary pixel circuit PCa for driving the auxiliary sub-pixels Pa in the first area DA1 is located not in the peripheral area NDA, but instead is located in a middle area MA between the second area DA2 and the first area DA1. The auxiliary pixel circuit PCa may be arranged in middle area MA adjacent to the first area DA1. In the following description, a difference from the above-described embodiments corresponding to FIGS. 4 and 5 is mainly described.

Referring to FIGS. 6 and 7, the display area DA may include the first area DA1 that is a component area, the second area DA2 that is a main display area, and the middle area MA located in at least a partial area between the first area DA1 and the second area DA2.

The first area DA1 and the middle area MA are arranged in the display area DA, and at least partially surrounded by the second area DA2. A plurality of first and second auxiliary sub-pixels Pa1 and Pa2 may be arranged in the first area DA1 and the middle area MA. Each of the auxiliary sub-pixels Pa1 and Pa2 may be implemented, as a light-emitting device, by a display element such as the organic light-emitting diode OLED. Each auxiliary sub-pixel Pa may emit, for example, red, green, blue, or white light.

The first auxiliary sub-pixel Pa1 may be implemented in the first area DA1, and the second auxiliary sub-pixel Pa2 may be implemented in the middle area MA. This means that the first auxiliary sub-pixel Pa1 substantially emits light in the first area DA1, and the second auxiliary sub-pixel Pa2 substantially emits light in the middle area MA.

A first auxiliary pixel circuit PCa1 for driving the first auxiliary sub-pixel Pa1, and a second auxiliary pixel circuit PCa2 for driving the second auxiliary sub-pixel Pa2, may both be arranged in the middle area MA. In this case, as a first auxiliary display element EDa1 for implementing the first auxiliary sub-pixel Pa1 is arranged in the first area DA1, and the first auxiliary pixel circuit PCa1 is arranged in the middle area MA, the first auxiliary display element EDa1 and first the auxiliary pixel circuit PCa may be connected to each other by the connection wiring TWL.

As illustrated in FIG. 6, a display layer DPL may include the circuit layer PCL including thin film transistors TFTm, TFTa1, and TFTa2, the display element layer EDL including display elements EDm, EDa1, and EDa2 that are light-emitting devices, and the thin film encapsulation layer TFE or the sealing member ENM, such as a sealing substrate. The insulating layers IL and IL' may be arranged between the substrate 100 and the display element layer EDL and in the display layer DPL. For example, the display elements EDm, EDa1, and EDa2 may be organic light-emitting diodes.

The first auxiliary display element EDa1 is arranged in the first area DA1 of the display panel 10 to implement the first auxiliary sub-pixel Pa1. In one or more embodiments, the first auxiliary pixel circuit PCa1 may be arranged not to overlap the first auxiliary display element EDa1. In other words, the first auxiliary pixel circuit PCa1 for driving the first auxiliary display element EDa1 may be arranged in the middle area MA between the second area DA2 and the first area DA1. Alternatively, in one or more other embodiments, the first auxiliary pixel circuit PCa1 for driving the first auxiliary display element EDa1 may be arranged in the middle area MA and the peripheral area NDA.

The first auxiliary pixel circuit PCa1 may include at least one first auxiliary thin film transistor TFTa1, and may be electrically connected to first the auxiliary emission element EDa through the connection wiring TWL. The connection wiring TWL may include a transparent conductive material. The first auxiliary pixel circuit PCa1 may control an operation of the first auxiliary display element EDa1. The first auxiliary sub-pixel Pa1 may be implemented through the light-emission of the first auxiliary display element EDa1.

An area of the first area DA1 where the first auxiliary display element EDa1 is not arranged may be defined as the transmissive area TA. The transmissive area TA may be an area through which light/signal emitted from a component 40 arranged corresponding to the first area DA1 or light/signal incident on the component 40 is transmitted.

The connection wiring TWL connecting the first auxiliary pixel circuit PCa1 and the first auxiliary display element EDa1 may be arranged in the transmissive area TA. The connection wiring TWL may include a transparent conductive material having relatively high transmittance, and even when the connection wiring TWL is arranged in the transmissive area TA, the transmittance of the transmissive area TA may be secured. In one or more embodiments, as the auxiliary pixel circuit PCa is not arranged in the first area DA1, the area of the transmissive area TA may be easily expanded, and light transmittance may be improved.

As a second auxiliary display element EDa2 and the second auxiliary pixel circuit PCa2 connected thereto are arranged in the middle area MA of the display panel 10, the second auxiliary sub-pixel Pa2 may be implemented. The first auxiliary pixel circuit PCa1 and the second auxiliary pixel circuit PCa2 arranged in the middle area MA may be arranged alternately adjacent to each other.

As illustrated in FIG. 6, a bottom metal layer BML may be arranged below the first and second auxiliary pixel circuits PCa1 and PCa2 of the middle area MA. The bottom metal layer BML may be arranged overlapping the first and second auxiliary pixel circuits PCa1 and PCa2 to protect the same. In one or more embodiments, the bottom metal layer BML may be arranged between the substrate 100 corresponding to the middle area MA and the first and second auxiliary pixel circuits PCa1 and PCa2, to overlap the first and second auxiliary pixel circuits PCa1 and PCa2. The bottom metal layer BML may block or reduce the external light from reaching the first and second auxiliary pixel circuits PCa1 and PCa2. In one or more other embodiments, the bottom metal layer BML is formed to correspond to the entire display area DA, and may be provided to include a lower hole corresponding to the first area DA1. The bottom metal layer BML may be applied to the above-described embodiments corresponding to FIG. 4. In one or more other embodiments, the bottom metal layer BML may be omitted.

As illustrated in FIG. 7, the pixel circuits PCm, PCa1, and PCa2 for respectively driving the sub-pixels Pm, Pa1, and Pa2 in the display area DA may be respectively electrically connected to external circuits arranged in the peripheral area NDA. The first scan driving circuit SDR1, the second scan driving circuit SDR2, the terminal portion PAD, the driving voltage supply line 11, and the common voltage supply line 13 may be arranged in the peripheral area NDA.

Figure 8A:
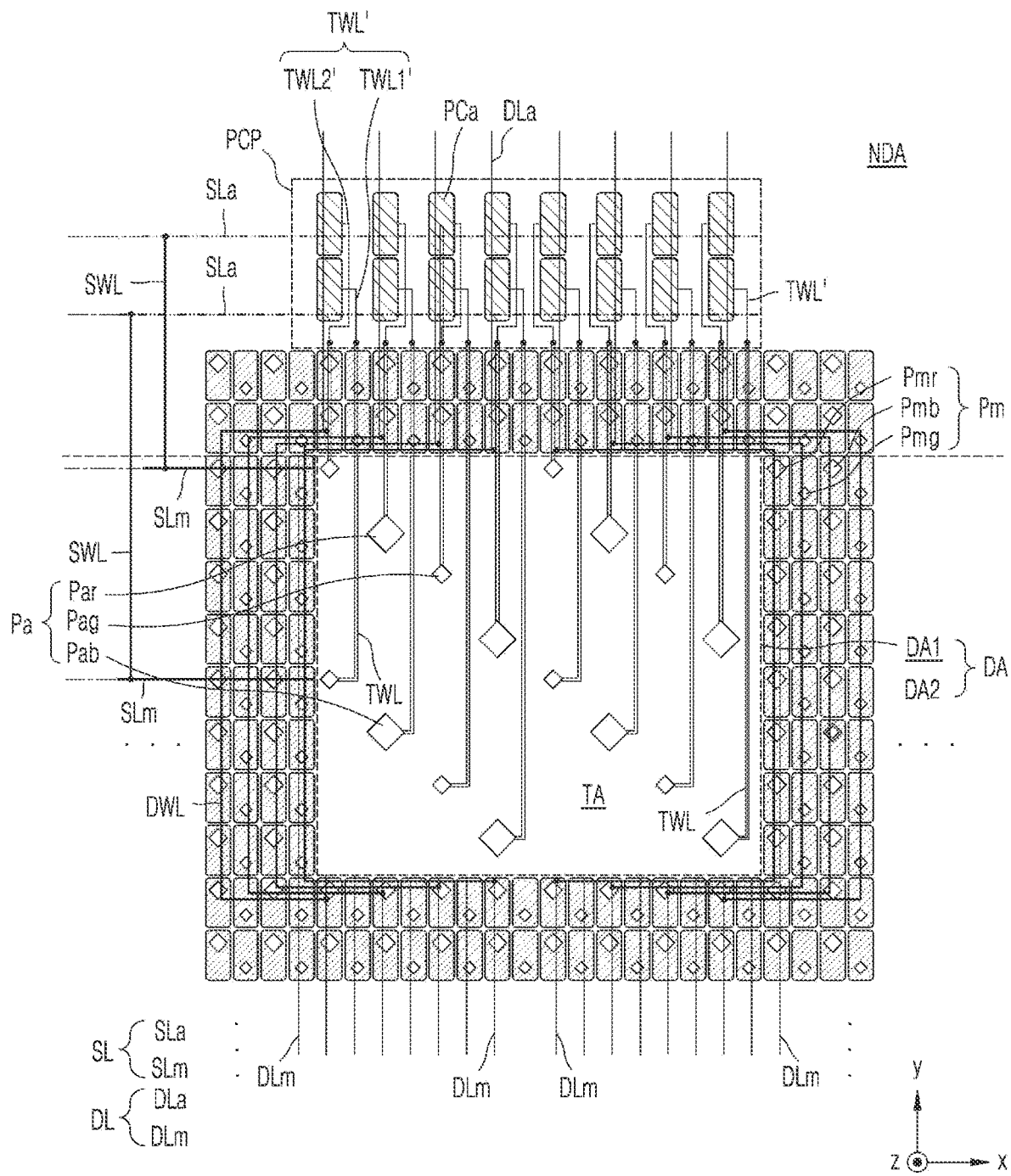
FIGS. 8A and 8B are schematic plan views showing partial areas of a display panel, according to one or more embodiments.

FIG. 8A is a schematic plan view showing a partial area of the display panel 10, according to one or more embodiments.

In detail, FIG. 8A illustrates the first area DA1, the second area DA2 therearound, and a pixel circuit portion PCP in the peripheral area NDA. FIG. 8A may correspond to part of FIG. 5 that is described above.

Referring to FIG. 8A, the main sub-pixels Pm may be arranged in the second area DA2. In the present specification, a main sub-pixels Pm may be a minimum unit for implementing an image as a sub-pixel, and may mean a light-emitting area that emits light by a display element. When the organic light-emitting diode OLED is employed as a display element, the light-emitting area may be defined by an opening of a pixel defining layer, which is described below. Each of the main sub-pixels Pm may emit light of light of any one of red, green, blue and white.

In some embodiments, the main sub-pixels Pm arranged in the second area DA2 may include a first sub-pixel Pmr, a second sub-pixel Pmg, and a third sub-pixel Pmb. The first sub-pixel Pmr, the second sub-pixel Pmg, and the third sub-pixel Pmb may implement red, green, and blue light, respectively. The main sub-pixels Pm may be arranged in a PENTILE™ structure (e.g., PENTILE™ matrix structure, PENTILE™ being a registered trademark of Samsung Display Co., Ltd., Republic of Korea). Through the above pixel arrangement structure, by employing rendering driving of sharing adjacent pixels to express a color, a high resolution may be implemented with a small number of pixels.

FIG. 8A illustrates that the main sub-pixels Pm are arranged in the PENTILE™ matrix structure, but the disclosure is not limited thereto. For example, the main sub-pixels Pm may be arranged in various shapes such as a stripe structure, a mosaic arrangement structure, a delta arrangement structure, and the like.

In the second area DA2, the main pixel circuits PCm may be arranged overlapping the main sub-pixels Pm, and the main pixel circuits PCm may be arranged in a matrix shape in the x direction and y direction. In the present specification, the main pixel circuit PCm may mean a unit of a pixel circuit for implementing one main sub-pixel Pm.

The auxiliary sub-pixels Pa may be arranged in the first area DA1. Each of the auxiliary sub-pixels Pa may emit light of any one color of red, green, blue, and white, as a sub-pixel. The auxiliary sub-pixels Pa may include a first sub-pixel Par, a second sub-pixel Pag, and a third sub-pixel Pab, which respectively emit different colors. The first sub-pixel Par, the second sub-pixel Pag, and the third sub-pixel Pab may implement red, green, and blue, respectively.

The number per unit area of the auxiliary sub-pixels Pa arranged in the first area DA1 may be less than the number per unit area of the main sub-pixels Pm arranged in the second area DA2. For example, the number of the auxiliary sub-pixels Pa and the number of the main sub-pixels Pm, which are arranged per equal area, may be a ratio of about 1:2, about 1:4, about 1:8, or about 1:9. In other words, the resolution of the first area DA1 may be about ½, about ¼, about ⅛, or about ⅑ of the resolution of the second area DA2. FIG. 4 illustrates a case in which the resolution of the first area DA1 is ⅛ of the resolution of the second area DA2.

The auxiliary sub-pixels Pa arranged in the first area DA1 may have various shapes. The auxiliary sub-pixels Pa may form a pixel group as some of the auxiliary sub-pixels Pa gather, and may be arranged, in the pixel group, in various shapes such as a PENTILE™ structure, a stripe structure, a mosaic arrangement structure, a delta arrangement structure, and the like.

Alternatively, as illustrated in FIG. 8A, the auxiliary sub-pixels Pa may be arranged and distributed in the first area DA1. In other words, a distance between the auxiliary sub-pixels Pa may be greater than a distance between the main sub-pixels Pm. An area of the first area DA1, where the auxiliary sub-pixels Pa are not arranged, may be the transmissive area TA having high light transmittance.

Figure 8B:
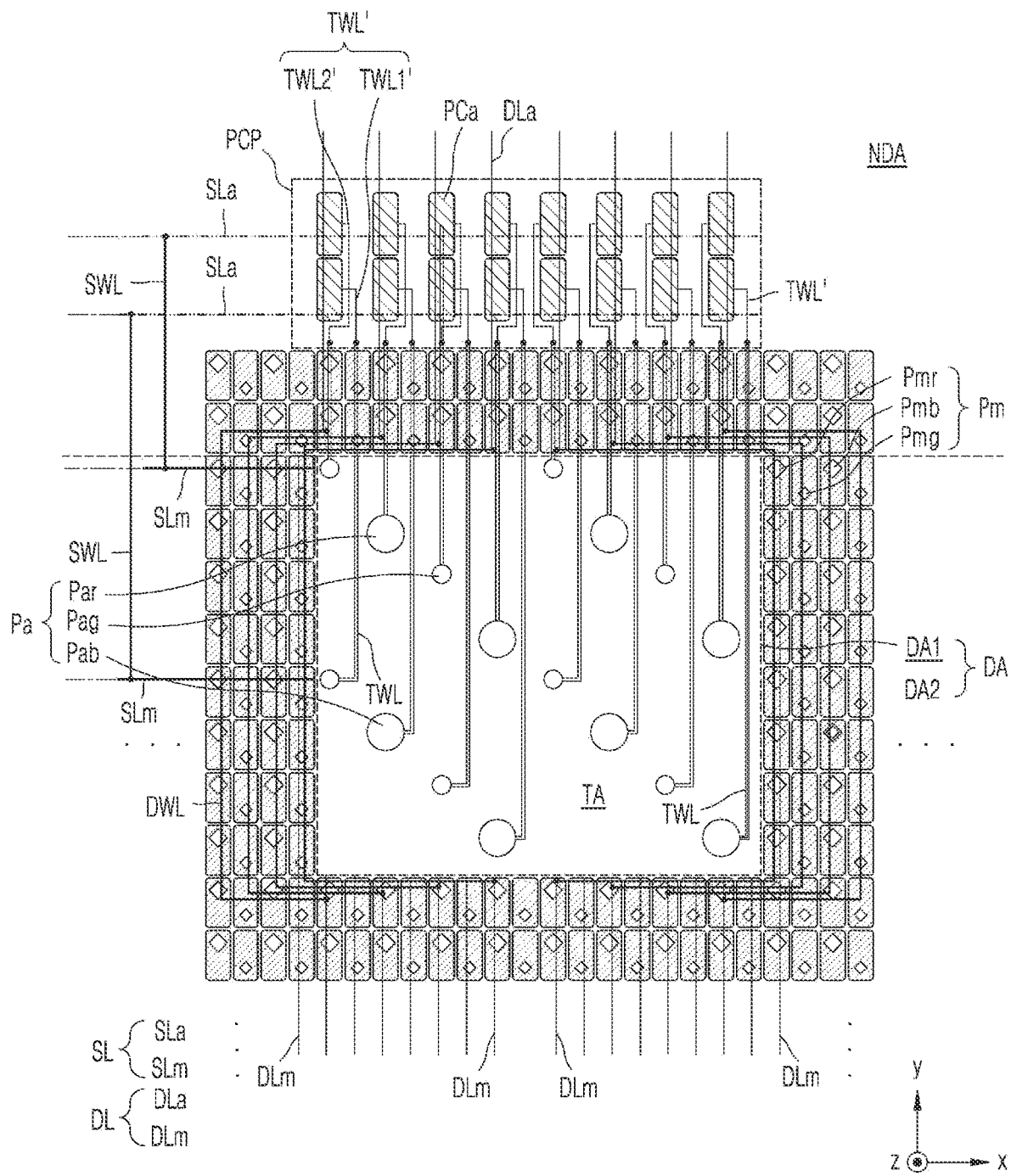

The auxiliary sub-pixels Pa arranged in the first area DA1 may be provided in a rhombic (or rectangular) shape as illustrated in FIG. 8A. Alternatively, the auxiliary sub-pixels Pa arranged in the first area DA1 may be provided in a circular (or oval) shape, as illustrated in FIG. 8B. The shape of the auxiliary sub-pixels Pa may mean the shape in a light-emitting area. In other words, the shape of the auxiliary sub-pixels Pa may be defined through an opening of a pixel defining layer 119 of FIG. 9A and the like that is described below.

Furthermore, the shape of a second pixel electrode 121' (see FIG. 9A) of each of the auxiliary sub-pixels Pa may not necessarily be similar to the shape of a light-emitting area, but the second pixel electrode 121' of each of the auxiliary sub-pixels Pa may suitably reduce diffraction and scattering of light in a process of transmitting light in the transmissive area TA. Accordingly, in this case, the second pixel electrode 121' of each of the auxiliary sub-pixels Pa, which has a circular shape similar to the circular shape of the light-emitting area as illustrated in FIG. 8B, may reduce diffraction and scattering of light by an edge, a corner, and the like of the second pixel electrode 121'.

The auxiliary pixel circuits PCa that implement the light-emitting of the auxiliary sub-pixels Pa may be arranged in the peripheral area NDA. As the auxiliary pixel circuits PCa are not arranged in the first area DA1, the transmissive area TA greater than the first area DA1 may be secured. Furthermore, as wirings that apply a constant voltage and signals to the auxiliary pixel circuit PCa are not arranged in the first area DA1, the auxiliary sub-pixels Pa may be freely arranged without considering the arrangement of the wirings.

The auxiliary pixel circuits PCa may be connected to the auxiliary sub-pixels Pa by connection wirings. The connection wirings may include at least one of a transparent connection wiring TWL or a metal connection wiring TWL'.

The transparent connection wiring TWL may be arranged at least partially in the first area DA1, and may include a transparent conductive material. For example, the transparent connection wiring TWL may include a transparent conducting oxide (TCO). The transparent connection wiring TWL may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO).

The connection of the transparent connection wiring TWL to the auxiliary sub-pixels Pa may mean that the transparent connection wiring TWL is electrically connected to a pixel electrode of an auxiliary display element that implements the auxiliary sub-pixels Pa.

The transparent connection wiring TWL may be connected to the auxiliary pixel circuits PCa through the metal connection wiring TWL'. The metal connection wiring TWL' may be a wiring that is arranged in the peripheral area NDA and connected to the auxiliary pixel circuit PCa.

The metal connection wiring TWL' may include a conductive material including molybdenum (Mo), aluminum (Al), copper (Cu), titanium (Ti), and the like, and may be formed as a multilayer or a single layer including the above material. The metal connection wiring TWL' may include a plurality of metal connection wirings between the auxiliary pixel circuits PCa.

In some embodiments, the metal connection wiring TWL' may include a first metal connection wiring TWL1' and a second metal connection wiring TWL2', which are arranged in different layers. For example, the first metal connection wiring TWL1' may be arranged in the same layer as a data line DL, and may include the same material as the data line DL. The second metal connection wiring TWL2' may be arranged with the first metal connection wiring TWL1' and an insulating layer therebetween. For example, the second metal connection wiring TWL2' is arranged in the same layer as a first pixel electrode 121 (see FIG. 9A) of the organic light-emitting diode OLED, and may include the same material as the first pixel electrode 121. Alternatively, the second metal connection wiring TWL2' may be arranged in the same layer as a connection electrode CM (see FIG. 9A), and may include the same material as the connection electrode CM.

The first metal connection wiring TWL1' and the second metal connection wiring TWL2' may be arranged between the auxiliary pixel circuits PCa, and may be provided as being at least partially bent on a plane. In some embodiments, the first metal connection wiring TWL1' and the second metal connection wiring TWL2', which are arranged in different layers, may each include a plurality of metal connection wirings, and the first metal connection wiring TWL1' and the second metal connection wiring TWL2' may be alternately arranged in an area between the auxiliary pixel circuits PCa.

The transparent connection wiring TWL may be arranged in the first area DA1, and may be connected to the metal connection wiring TWL' at an edge of the first area DA1. The transparent connection wiring TWL may include a transparent conductive material.

The metal connection wiring TWL' and the transparent connection wiring TWL may be arranged in the same layer or in different layers. When the metal connection wiring TWL' and the transparent connection wiring TWL are arranged in different layers, the metal connection wiring TWL' and the transparent connection wiring TWL may be connected to each other through a contact hole.

The metal connection wiring TWL' may have higher conductivity than that of the transparent connection wiring TWL. As the metal connection wiring TWL' is arranged in the peripheral area NDA, there is no need to secure light transmittance, and thus, a material having lower light transmittance but higher conductivity than the transparent connection wiring TWL may be employed. Accordingly, a resistance value of the transparent connection wiring TWL may be reduced.

The scan line SL may include a main scan line SLm connected to the main pixel circuits PCm and an auxiliary scan line SLa connected to the auxiliary pixel circuits PCa. The main scan line SLm may extend in the x direction, and may be connected to the main pixel circuits PCm that is arranged in the same row. The main scan line SLm may not be arranged in the first area DA1. In other words, the main scan line SLm may be short-circuited with respect to the first area DA1. In this case, the main scan line SLm arranged to the left of the first area DA1 may receive a signal from a first scan driving circuit SDR1 (see FIG. 5 or 7), while the main scan line SLm arranged to the right of the first area DA1 may receive a signal from a second scan driving circuit SDR2 (see FIG. 5 or 7).

The auxiliary scan line SLa may be connected to the auxiliary pixel circuits PCa for driving the auxiliary sub-pixels Pa arranged in the same row among the auxiliary pixel circuits PCa arranged in the same row.

The main scan line SLm and the auxiliary scan line SLa may be connected by a scan connection line SWL, and the same signal may be applied to the main sub-pixels Pm arranged in the same row and to the auxiliary pixel circuits PCa for driving the auxiliary sub-pixels Pa.

The scan connection line SWL is arranged in a different layer from the main scan line SLm and the auxiliary scan line SLa, and the scan connection line SWL may be connected to each of the main scan line SLm and the auxiliary scan line Sla through contact holes. The scan connection line SWL may be arranged in the peripheral area NDA.

The data line DL may include the main data line DLm connected to the main pixel circuits PCm, and an auxiliary data line DLa connected to the auxiliary pixel circuits PCa. The main data line DLm may extend in the y direction, and may be connected to the main pixel circuits PCm arranged in the same row. The auxiliary data line DLa may extend in the y direction, and may be connected to the auxiliary pixel circuits PCa arranged in the same row.

The main data line DLm and the auxiliary data line DLa may be arranged apart from each other with the first area DA1 therebetween. The main data line DLm and the auxiliary data line DLa may be connected by a data connection line DWL, and the same signal may be applied to the main sub-pixels Pm arranged in the same column, along with the auxiliary pixel circuits PCa for driving the auxiliary sub-pixels Pa.

The data connection line DWL may be arranged to bypass the first area DA1. The data connection line DWL may be arranged overlapping the main pixel circuits PCm arranged in the second area DA2. As the data connection line DWL is arranged in the second area DA2, there is no need to secure a separate space where the data connection line DWL is arranged, and thus, a dead space area may be reduced.

As the data connection line DWL is arranged in a different layer from the main data line DLm and the auxiliary data line DLa, the data connection line DWL may be connected to each of the main data line DLm and the auxiliary data line DLa through contact holes.

Figure 9A:
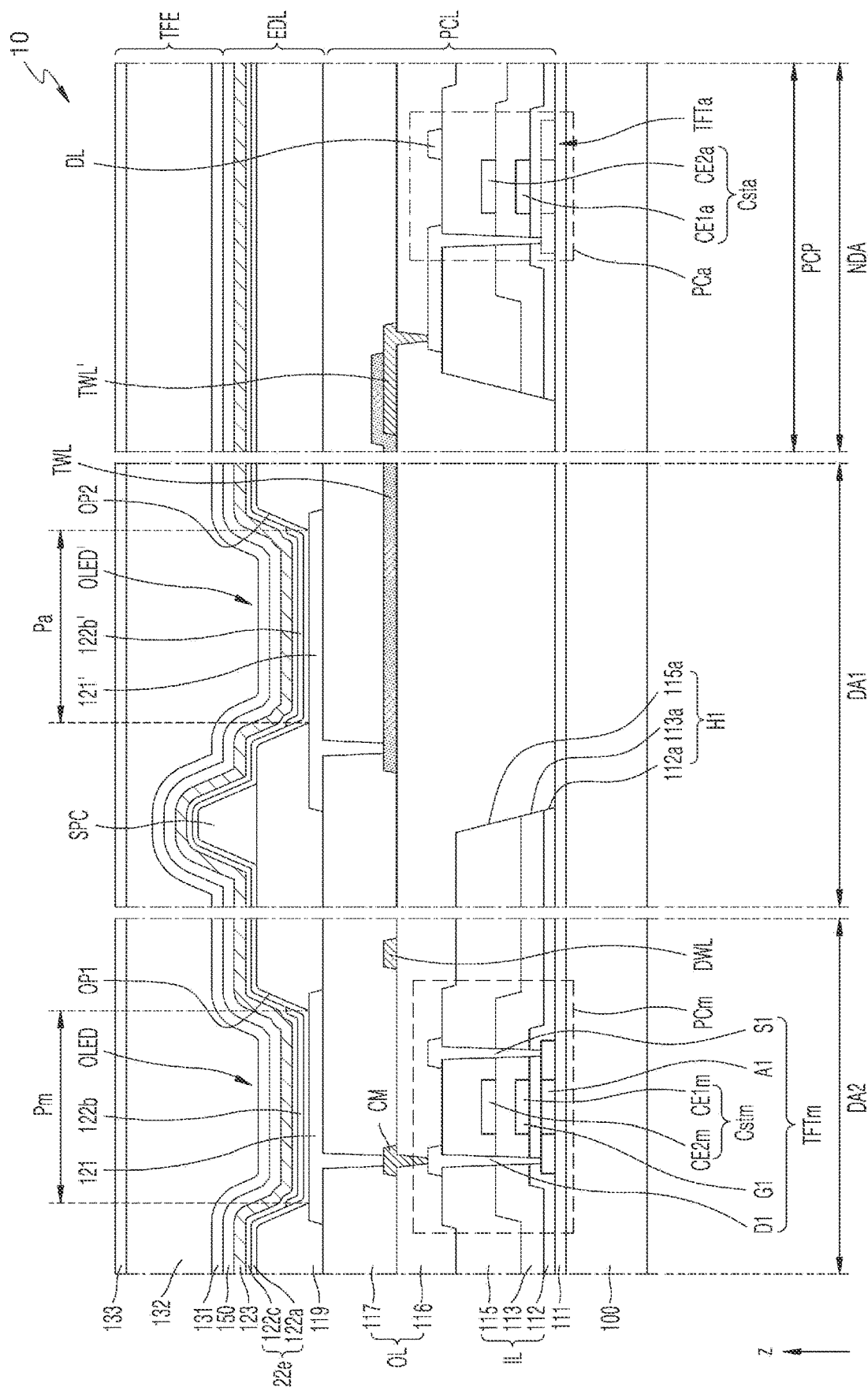
FIGS. 9A and 9B are schematic cross-sectional views showing partial areas of a display panel, according to one or more embodiments.

FIG. 9A is a schematic cross-sectional view showing parts of the display panel 10, that is, parts of the first area DA1, the second area DA2, and the peripheral area NDA, according to one or more embodiments.

Referring to FIG. 9A, the auxiliary sub-pixels Pa are arranged in the first area DA1, and the main sub-pixels Pm are arranged in the second area DA2.

A second organic light-emitting diode OLED' may be arranged in the first area DA1 as an auxiliary display element. A second pixel circuit PCa including an auxiliary thin film transistor TFTa and an auxiliary storage capacitor Csta may be arranged in the peripheral area NDA. The transparent connection wiring TWL for connecting the second pixel circuit PCa to the second organic light-emitting diode OLED' may be arranged in the second area DA2 and the peripheral area NDA.

The main pixel circuit PCm including the main thin film transistor TFTm and a main storage capacitor Cstm, and a first organic light-emitting diode OLED, as a main display element, and which is connected to the main pixel circuit PCm, may be arranged in the second area DA2.

In one or more embodiments, an example in which an organic light-emitting diode OLED is employed as a display element is described. In one or more other embodiments, an inorganic emission element or a quantum-dot emission element may be employed as a display element.

A structure in which elements included in the display panel 10 are stacked is described below. The display panel 10 may be provided by stacking the substrate 100, a buffer layer 111, the circuit layer PCL, and the display element layer EDL.

The buffer layer 111 may be located on the substrate 100, may reduce or prevent infiltration of foreign materials such as moisture or external air from under the substrate 100, and may provide a planarized surface to an upper portion of the substrate 100. The buffer layer 111 may include an inorganic material, such as an oxide or a nitride, an organic material, or an organic/inorganic complex, and may have a single layer or multilayer structure of an inorganic material and an organic material. In one or more embodiments, a barrier layer for reducing or blocking infiltration of external air may be further provided between the substrate 100 and the buffer layer 111. In some embodiments, the buffer layer 111 may include a silicon oxide ($SiO_2$) or a silicon nitride ($SiN_x$).

The circuit layer PCL is arranged above the buffer layer 111, and may include the pixel circuits PCm and PCa, a first gate insulating layer 112, a second gate insulating layer 113, an interlayer insulating layer 115, a first organic insulating layer 116, and a second organic insulating layer 117. The main pixel circuit PCm may include the main thin film transistor TFTm and the main storage capacitor Cstm, and the auxiliary pixel circuit PCa may include the auxiliary thin film transistor TFTa and the auxiliary storage capacitor Csta.

The main thin film transistor TFTm and the auxiliary thin film transistor TFTa may be arranged above the buffer layer 111. The main thin film transistor TFTm may include a first semiconductor layer A1, a first gate electrode G1, a first source electrode S1, and a first drain electrode D1. The main thin film transistor TFTm may be connected to the first organic light-emitting diode OLED to drive the first organic light-emitting diode OLED. The auxiliary thin film transistor TFTa may be connected to the second organic light-emitting diode OLED' to drive the second organic light-emitting diode OLED'. As the auxiliary thin film transistor TFTa has a similar structure to the main thin film transistor TFTm, the description of the auxiliary thin film transistor TFTa is replaced with the description of the main thin film transistor TFTm.

The first semiconductor layer A1 is arranged above the buffer layer 111 and may include polysilicon. In one or more other embodiments, the first semiconductor layer A1 may include amorphous silicon. In one or more other embodiments, the first semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), Ti, and zinc (Zn). The first semiconductor layer A1 may include a channel region, and may include a source region and a drain region that are doped with impurities.

The first gate insulating layer 112 may be provided to cover the first semiconductor layer A1. The first gate insulating layer 112 may include an inorganic insulating material such as $SiO_2$, $SiN_x$, a silicon oxynitride (SiOxNy), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$). The first gate insulating layer 112 may be a single layer or multilayer including the above-described inorganic insulating material.

The first gate electrode G1 is arranged above the first gate insulating layer 112 to overlap the first semiconductor layer A1. The first gate electrode G1 may include Mo, Al, Cu, Ti, and the like, and may be provided as a single layer or multilayer. As an example, the first gate electrode G1 may be a single layer of Mo.

The second gate insulating layer 113 may be provided to cover the first gate electrode G1. The second gate insulating layer 113 may include an inorganic insulating material such as $SiO_2$, $SiN_x$, SiOxNy, $Al_2O_3$, $TiO_2$, $Ta_2O_5$, $HfO_2$, $ZnO_2$, or the like. The second gate insulating layer 113 may be a single layer or multilayer including the above-described inorganic insulating material.

An upper electrode CE2m of the main storage capacitor Cstm and an upper electrode CE2a of the auxiliary storage capacitor Csta may be arranged above the second gate insulating layer 113.

The upper electrode CE2m of the main storage capacitor Cstm may overlap the first gate electrode G1 thereunder in the second area DA2. The first gate electrode G1 and the upper electrode CE2m, which overlap each other with the second gate insulating layer 113 therebetween, may constitute the main storage capacitor Cstm. The first gate electrode G1 may also function as a lower electrode CE1m of the main storage capacitor Cstm.

The upper electrode CE2a of the auxiliary storage capacitor Csta may overlap a gate electrode of the auxiliary thin film transistor TFTa thereunder in the peripheral area NDA.

The gate electrode of the auxiliary thin film transistor TFTa may also function as a lower electrode CE1a of the auxiliary storage capacitor Csta.

The upper electrodes CE2m and CE2a may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer of the above-described material.

The interlayer insulating layer 115 may cover the upper electrodes CE2m and CE2a. The interlayer insulating layer 115 may include $SiO_2$, $SiN_x$, SiOxNy, $Al_2O_3$, $TiO_2$, $Ta_2O_5$, $HfO_2$, $ZnO_2$, or the like. The interlayer insulating layer 115 may be a single layer or multilayer including the above-described inorganic insulating material.

A source electrode S1 and a drain electrode D1 may be arranged above the interlayer insulating layer 115. The source electrode S1 and the drain electrode D1 may include a conductive material including Mo, Al, Cu, Ti, and the like, and may be provided as a multilayer or a single layer including the above-described material. As an example, the source electrode S1 and the drain electrode D1 may have a multilayer structure of Ti/Al/Ti.

An inorganic insulating layer IL of the display panel 10 may include an opening H1 corresponding to the first area DA1. For example, when the first gate insulating layer 112, the second gate insulating layer 113, and the interlayer insulating layer 115 are collectively referred to as the inorganic insulating layer IL, the inorganic insulating layer IL may have the opening H1 corresponding to the first area DA1. The opening H1 may expose part of an upper surface of the substrate 100 or the buffer layer 111. The opening H1 may include a first opening 112a of the first gate insulating layer 112, a second opening 113a of the second gate insulating layer 113, and a third opening 115a of the interlayer insulating layer 115, which are overlapped with one another and formed to correspond to the first area DA1. The openings 112a, 113a, and 115a may each be formed in a separate process, or may be concurrently or substantially simultaneously formed in the same process. The opening H1 of the inorganic insulating layer IL may be filled with the first organic insulating layer 116.

The first organic insulating layer 116 may cover the source electrodes S1 and S2 and the drain electrodes D1 and D2 of the second area DA2 and the peripheral area NDA, and may fill the opening H1 of the inorganic insulating layer IL in the first area DA1.

The first organic insulating layer 116 may include general purpose polymers such as photosensitive polyimide, polyimide, polystyrene (PS), polycarbonate (PC), BCB, hexamethyldisiloxane (HMDSO), polymethylmethacrylate (PMMA), or PS, polymer derivatives having a phenolic group, acrylic polymer, imide-based polymer, arylether-based polymer, amide-based polymer, fluorine-based polymer, p-xylene-based polymer, vinyl alcohol-based polymer, or the like.

Alternatively, the first organic insulating layer 116 may include a siloxane organic material. The siloxane organic material may include hexamethyldisiloxane, octamethyltrisiloxane, decamethyltetrasiloxane, dodecamethylpentasiloxane, and polydimethylsiloxane.

A refractive index of the first organic insulating layer 116 may be about 1.4 to about 1.6 with respect to a 550 nm wavelength. A connection electrode CM and various wirings, for example, the data line DL, may be arranged above the first organic insulating layer 116, which is advantageous to high integration.

The transparent connection wiring TWL may be provided above the first organic insulating layer 116 in the first area DA1. The transparent connection wiring TWL extends from the peripheral area NDA to the second area DA2, and may connect between the second organic light-emitting diode OLED' and the auxiliary pixel circuit PCa.

The transparent connection wiring TWL may be connected to the metal connection wiring TWL'. The metal connection wiring TWL' is arranged in the peripheral area NDA to be connected to the auxiliary pixel circuit PCa, for example, the auxiliary thin film transistor TFTa. The transparent connection wiring TWL may be arranged in the transmissive area TA of the first area DA1. An end portion of the transparent connection wiring TWL may cover an end portion of the metal connection wiring TWL'.

The metal connection wiring TWL' may include a conductive material including Mo, Al, Cu, Ti, and the like, and may be a multilayer or a single layer including the above-described material. In some embodiments, the metal connection wiring TWL' may be arranged on the same layer as the connection electrode CM, and may include the same material as the connection electrode CM. In some embodiments, the metal connection wiring TWL' may be arranged on the same layer as the data line DL, and may include the same material as the data line DL. However, the disclosure is not limited thereto. The metal connection wiring TWL' may be arranged in various layers. For example, the metal connection wiring TWL' may be arranged in the same layer as the first pixel electrode 121.

The transparent connection wiring TWL may include a transparent conductive material. For example, the transparent connection wiring TWL may include a transparent conducting oxide (TCO). The transparent connection wiring TWL may include a conductive oxide such as ITO, IZO, ZnO, $In_2O_3$, IGO, or AZO.

The metal connection wiring TWL' may have higher conductivity than the transparent connection wiring TWL. As the metal connection wiring TWL' is arranged in the peripheral area NDA, there is no need to secure light transmittance, and thus, a material having lower light transmittance than, but also having higher conductivity than, the transparent connection wiring TWL may be employed.

The second organic insulating layer 117 may be arranged above the first organic insulating layer 116 to cover the transparent connection wiring TWL. The second organic insulating layer 117 may have a flat upper surface such that the first pixel electrode 121 and the second pixel electrode 121' arranged above the second organic insulating layer 117 are formed flat. The second organic insulating layer 117 may include a siloxane organic material having high light transmittance and high flatness. The siloxane organic material may include hexamethyldisiloxane, octamethyltrisiloxane, decamethyltetrasiloxane, dodecamethylpentasiloxane, and polydimethylsiloxane.

Alternatively, the second organic insulating layer 117 may include general purpose polymers such as photosensitive polyimide, polyimide, BCB, HMDSO, PMMA, or PS, polymer derivatives having a phenolic group, acrylic polymer, imide-based polymer, arylether-based polymer, amide-based polymer, fluorine-based polymer, p-xylene-based polymer, vinyl alcohol-based polymer, or the like.

The organic light-emitting diodes OLED and OLED' may be arranged above the second organic insulating layer 117. The pixel electrodes 121 and 121' of the organic light-emitting diodes OLED and OLED' may be respectively connected to the pixel circuits PCm and PCa through the connection electrode CM and the transparent connection wiring TWL arranged above the first organic insulating layer 116.

The first pixel electrode 121 and the second pixel electrode 121' may include a conductive oxide such as ITO, IZO, ZnO, $In_2O_3$, IGO, or AZO. The first pixel electrode 121 and the second pixel electrode 121' may include a reflective film including Ag, Mg, Al, Pt, Pd, Au, Ni, Nd, Ir, Cr, or a compound thereof. For example, the first pixel electrode 121 and the second pixel electrode 121' may each have a structure having films including ITO, IZO, ZnO, or $In_2O_3$ above/below the above-described reflective film. In this case, the first pixel electrode 121 and the second pixel electrode 121' may have a stack structure of ITO/Ag/ITO.

A pixel defining layer 119 may include, or define, a first opening OP1 and a second opening OP2 that are arranged above the second organic insulating layer 117, may cover edges of each of the first pixel electrode 121 and the second pixel electrode 121', and may expose center portions of the first pixel electrode 121 and the second pixel electrode 121'. The first opening OP1 and the second opening OP2 define the size and the shape of a light-emitting area, that is, the sub-pixels Pm and Pa, of the organic light-emitting diodes OLED and OLED'.

The pixel defining layer 119 may reduce or prevent the likelihood of generation of an arc at the edges of the pixel electrodes 121 and 121' by increasing a distance between the edges of the pixel electrodes 121 and 121' and a counter electrode 123 that is above the pixel electrodes 121 and 121'. The pixel defining layer 119 may include an organic insulating material, such as polyimide, polyamide, acryl resin, benzocyclobutene, HMDSO, phenol resin, and the like, by a method such as spin coating and the like.

A spacer SPC may be arranged above the pixel defining layer 119. The spacer SPC may reduce or prevent the occurrence of scratches during a mask process. The spacer SPC may include an organic insulating material such as polyimide, polyamide, acryl resin, benzocyclobutene, HMDSO, phenol resin, and the like. In some embodiments, the spacer SPC may be concurrently or substantially simultaneously formed with the pixel defining layer 119 using the same material as the pixel defining layer 119 by using a half-tone mask.

A first emission layer 122b and a second emission layer 122b' are respectively arranged in the first opening OP1 and the second opening OP2 of the pixel defining layer 119 to respectively correspond to the first pixel electrode 121 and the second pixel electrode 121'. The first emission layer 122b and the second emission layer 122b' may include a polymer material or a low molecular weight material, and emit red, green, blue, or white light.

An organic functional layer 122e may be arranged above and/or below each of the first emission layer 122b and the second emission layer 122b' (e.g., may have respective portions above and below the first emission layer 122b and the second emission layer 122b'). The organic functional layer 122e may include a first functional layer 122a and/or a second functional layer 122c. The first functional layer 122a and/or the second functional layer 122c may be omitted in one or more other embodiments.

The first functional layer 122a may be arranged below the first emission layer 122b and the second emission layer 122b'. The first functional layer 122a may be a single layer or multilayer including an organic material. The first functional layer 122a may be a hole transport layer (HTL) having a single layer structure. Alternatively, the first functional layer 122a may include a hole injection layer (HIL) and a hole transport layer (HTL). The first functional layer 122a may be integrally formed to correspond to the organic light-emitting diodes OLED and OLED'.

The second functional layer 122c may be arranged above the first emission layer 122b and the second emission layer 122b'. The second functional layer 122c may be a single layer or multilayer including an organic material. The second functional layer 122c may include an electron transport layer (ETL) and/or an electron injection layer (EIL). The second functional layer 122c may be formed to correspond to the organic light-emitting diodes OLED and OLED' respectively included in the second area DA2 and the first area DA1.

The counter electrode 123 is arranged above the second functional layer 122c. The counter electrode 123 may include a conductive material having a low work function. For example, the counter electrode 123 may include a transparent or semi-transparent layer including Ag, Mg, Al, Pt, Pd, Au, Ni, Nd, Ir, Cr, lithium (Li), Ca, or an alloy thereof, and the like. Alternatively, the counter electrode 123 may further include a layer such as ITO, IZO, ZnO, or $In_2O_3$ above the transparent/semi-transparent layer including the above-described material. The counter electrode 123 may be integrally formed to correspond to the organic light-emitting diodes OLED and OLED'.

In the second area DA2, the layers from the first pixel electrode 121 to the counter electrode 123 may constitute the first organic light-emitting diode OLED. In the first area DA1, the layers from the second pixel electrode 121' to the counter electrode 123 may constitute the organic light-emitting diode OLED'.

An upper layer 150 including an organic material may be formed above the counter electrode 123. The upper layer 150 may be provided to protect the counter electrode 123 while also increasing light extraction efficiency. The upper layer 150 may include an organic material having a higher refractive index than the counter electrode 123. Alternatively, the upper layer 150 may be provided by stacking layers having different refractive indexes. For example, the upper layer 150 may be provided by stacking a high refractive index layer/a low refractive index layer/a high refractive index layer. In this state, the refractive index of the high refractive index layer may be about 1.7 or more, and the refractive index of the low refractive index layer may be about 1.3 or less.

The upper layer 150 may additionally include LiF. Alternatively, the upper layer 150 may additionally include an inorganic insulating material such as $SiO_2$ or $SiN_x$.

The thin film encapsulation layer TFE is arranged above the upper layer 150, and the organic light-emitting diodes OLED and OLED' may be sealed by the thin film encapsulation layer TFE. The thin film encapsulation layer TFE may reduce or prevent infiltration of external moisture or foreign materials into the organic light-emitting diodes OLED and OLED'.

The thin film encapsulation layer TFE may include at least one inorganic encapsulation layer and at least one organic encapsulation layer. In this regard, FIG. 9A illustrates that the thin film encapsulation layer TFE has a stack structure of the first inorganic encapsulation layer 131, the organic encapsulation layer 132, and the second inorganic encapsulation layer 133. In one or more other embodiments, the number of organic encapsulation layers, the number of inorganic encapsulation layers, and a stack order may be changed.

The first inorganic encapsulation layer 131 and the second inorganic encapsulation layer 133 may include one or more inorganic insulating materials such as $SiO_2$, $SiN_x$, SiOxNy, $Al_2O_3$, $TiO_2$, $Ta_2O_5$, $HfO_2$, or $ZnO_2$, and may be formed by a chemical deposition method (CVD) and the like. The organic encapsulation layer 132 may include a polymer-based material. The polymer-based material may include silicon-based resin, acrylic resin, for example, polymethyl-methacrylate, polyacryl acid, and the like, epoxy-based resin, polyimide, polyethylene, and the like. The first inorganic encapsulation layer 131, the organic encapsulation layer 132, and the second inorganic encapsulation layer 133 may be integrally formed to cover the first area DA1 and the second area DA2.

Figure 9B:
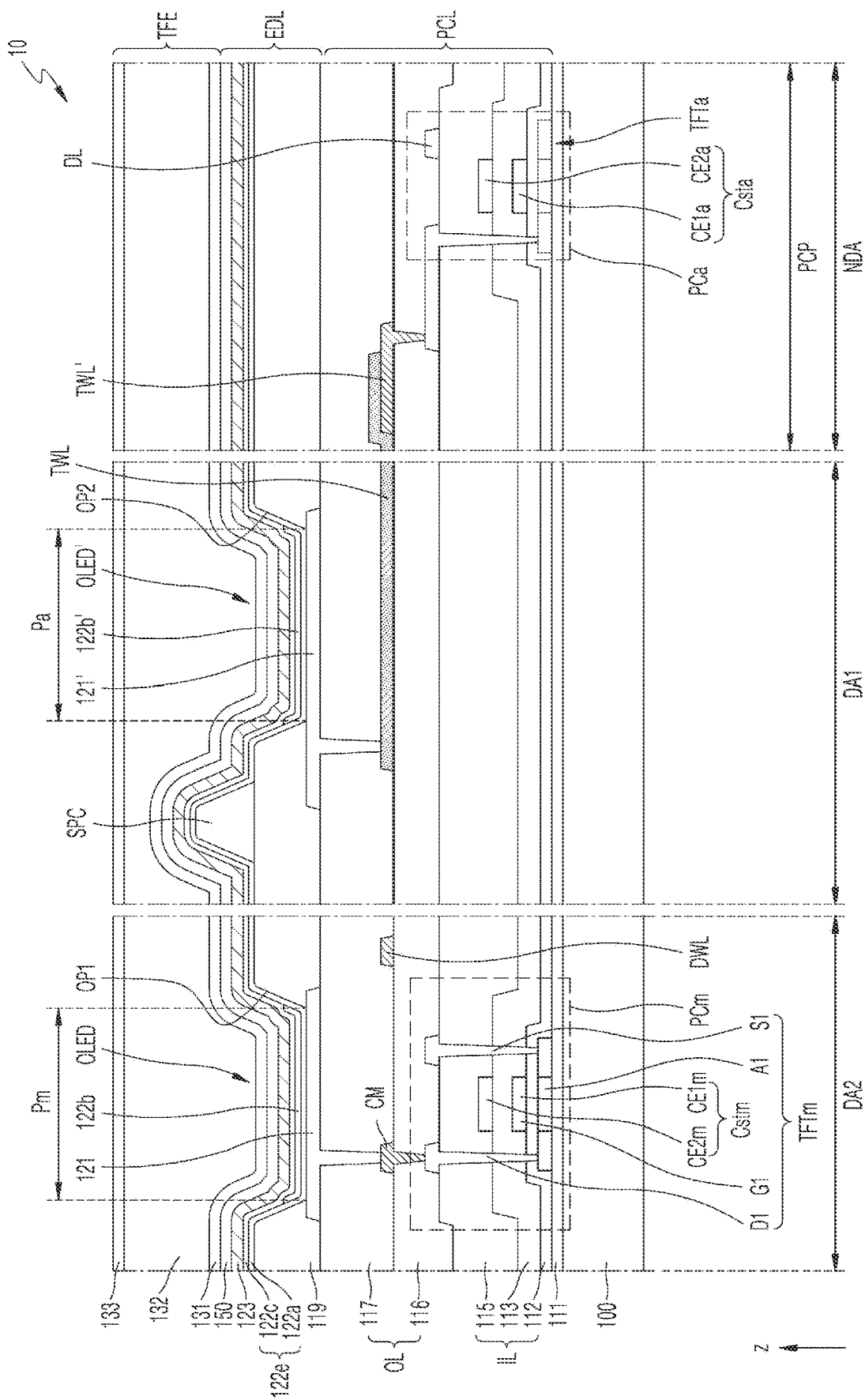

FIG. 9A illustrates that the inorganic insulating layer IL includes the opening H1 corresponding to the first area DA1, but the disclosure is not limited thereto. As illustrated in FIG. 9B, the inorganic insulating layer IL may not include an opening corresponding to the first area DA1, and may be continuously arranged in the first area DA1. Even when the inorganic insulating layer IL does not include an opening, the light transmittance of the first area DA1 may be secured through a relationship of the refractive indexes and the like of the inorganic insulating layer IL and an organic insulating layer OL.

Figure 10:
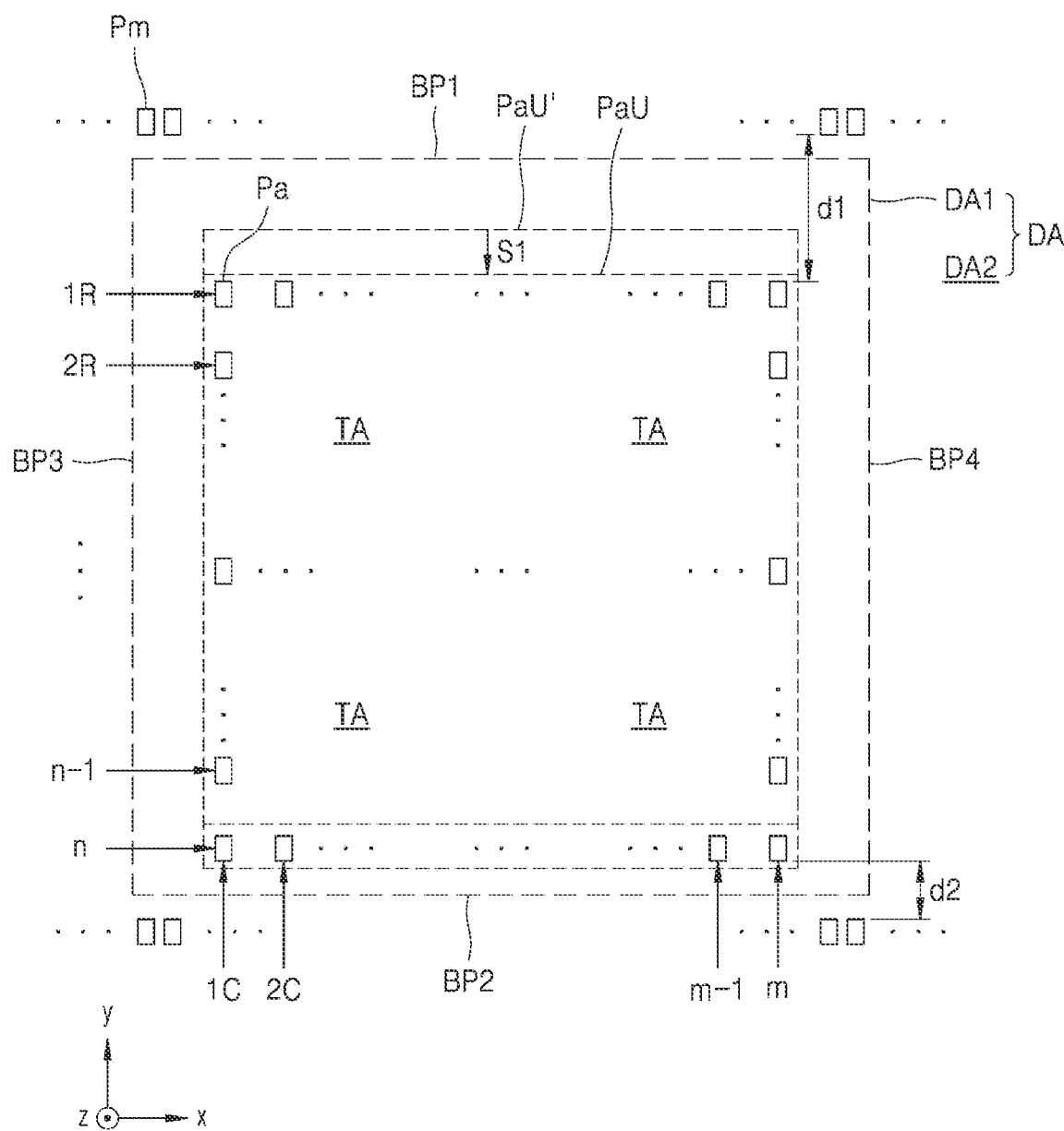
FIGS. 10 and 11 are schematic plan views showing parts of a display area, according to one or more embodiments.
Figure 11:
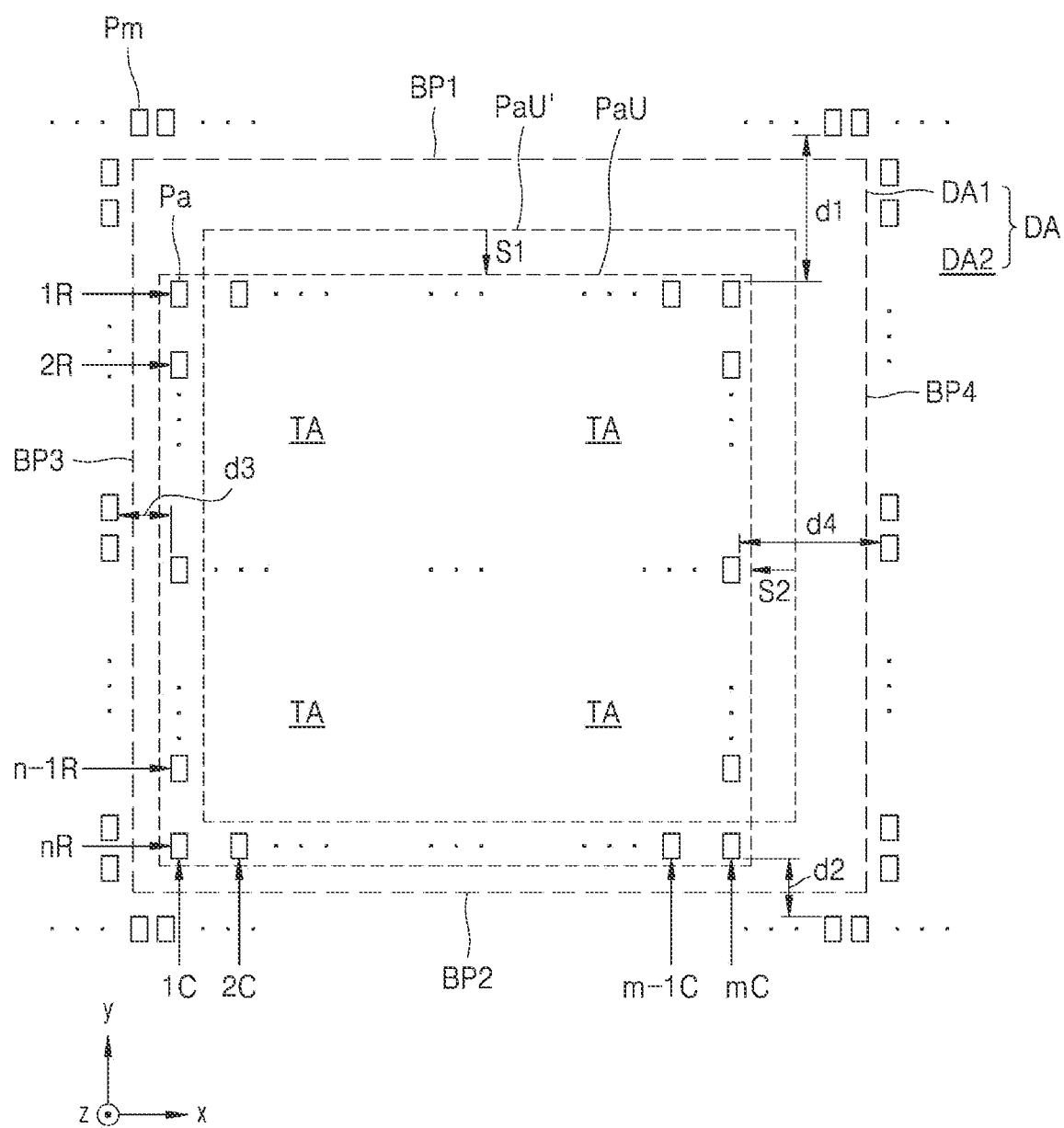

FIGS. 10 and 11 are schematic plan views showing part of a display area according to one or more embodiments.

Referring to FIG. 10 first, the display apparatus according to one or more embodiments may include the first area DA1 where the auxiliary sub-pixels Pa are arranged and the second area DA2 where the main sub-pixels Pm are arranged. The second area DA2 may be arranged to surround the first area DA1. In one or more embodiments, the auxiliary sub-pixels Pa arranged in the first area DA1 may be arranged to have a corresponding arrangement according to the first row to the n-th row (1R, 2R, ..., n−1R, and nR) and the first column to the m-th column (1C, 2C, ..., m−1C, and mC).

The first area DA1, as a kind of a component area, is where the auxiliary sub-pixels Pa are arranged, and an area where the auxiliary sub-pixels Pa are not arranged may function as the transmissive area TA. As illustrated in FIG. 10, the first interval d1 between the auxiliary sub-pixels Pa and the main sub-pixels Pm that are arranged closest to the first boundary portion BP1 may be different from the second interval d2 between the auxiliary sub-pixels Pa and others of the main sub-pixels Pm that are arranged closest to the second boundary portion BP2. FIG. 10 illustrates that the first interval d1 is greater than the second interval d2.

In other words, when all of the auxiliary sub-pixels Pa arranged in the first area DA1 are regarded as one auxiliary sub-pixel unit PaU, the auxiliary sub-pixel unit PaU may be arranged by being shifted by a first distance S1 in one direction, for example, in the −y direction, compared with a comparative example, in which the pixel unit PaU' is arranged at the center of the first area DA1. In other words, the auxiliary sub-pixel unit PaU may be arranged by being shifted by a certain distance (the first distance S1) in a direction from the first row 1R toward the n-th row nR, or in a direction opposite thereto. In this state, the pixel unit PaU' of the comparative example being arranged generally at the "center" of the first area DA1 may mean that the pixel unit PaU' is arranged apart from each of the first to fourth boundary portions BP1, BP2, BP3, and BP4, by the same distance. As the auxiliary sub-pixel unit PaU is arranged by being shifted in one direction, for example, in the −y direction, by the first distance S1, the abovementioned first interval d1 corresponding to the first boundary portion BP1 may be greater than the abovementioned second interval d2 corresponding to the second boundary portion BP2.

The above-described structure may be provided to remove luminance imbalance at the edge of the first area DA1 because a luminance in a corresponding boundary portion, for example, the first boundary portion BP1, in the first area DA1 is greater than a luminance in a boundary portion opposite thereto, for example, the second boundary portion BP2. The luminance imbalance may occur because the arrangements of the auxiliary sub-pixels Pa arranged at the edge of the first area DA1 are not identical with respect to the first to fourth boundary portions BP1, BP2, BP3, and BP4. For example, when first auxiliary sub-pixels having a relatively high luminance, for example, green sub-pixels, are arranged in the first boundary portion BP1, second auxiliary sub-pixels having a relatively low luminance, for example, red sub-pixels and/or blue sub-pixels, are arranged in the second boundary portion BP2, a luminance in the vicinity of the first boundary portion BP1 may be greater than a luminance in the vicinity of the second boundary portion BP2.

In other words, as in one or more embodiments, when the luminance of the first boundary portion BP1 is greater than the luminance of the second boundary portion BP2, by shifting the whole of the auxiliary sub-pixel unit PaU in a direction, for example, in the −y direction toward the second boundary portion BP2, the first interval d1 between the auxiliary sub-pixels Pa and the main sub-pixels Pm in the first boundary portion BP1 is implemented to be greater than the second interval d2 between the auxiliary sub-pixels Pa and the main sub-pixels Pm in the second boundary portion BP2, and thus, the luminance of the first boundary portion BP1 is decreased while the luminance of the second boundary portion BP2 is relatively increased, thereby mitigating or reducing the luminance imbalance of the auxiliary sub-pixels Pa arranged in the first area DA1.

Referring to FIG. 11, the auxiliary sub-pixel unit PaU may be arranged by being shifted in one direction, for example, in the −y direction, by the first distance S1, and also shifted in another direction, for example, in the −x direction, by a second distance S2, compared with the comparative example in which the pixel unit PaU' is generally arranged at the center of the first area DA1. As the auxiliary sub-pixel unit PaU is arranged by being shifted in one direction, for example, in the −y direction, and in another direction, for example, in the −x direction, respectively by the first and second distances S1 and S2, the first and fourth intervals d1 and d4 between the auxiliary sub-pixels Pa and the main sub-pixels Pm arranged closest to the first and fourth boundary portions BP1 and BP4 may be greater than the second and third intervals d2 and d3 between the auxiliary sub-pixels Pa and the main sub-pixels Pm arranged closest to the second and third boundary portions BP2 and BP3.

The above-described structure may be provided to remove luminance imbalance at the edge of the first area DA1 because a luminance in a corresponding boundary portion, for example, the first and fourth boundary portions BP1 and BP4, in the first area DA1 is greater than a luminance in a boundary portion opposite thereto, for example, the second and third boundary portions BP2 and BP3. For example, when green sub-pixels having a relatively high luminance are arranged in the first and fourth boundary portions BP1 and BP4, and red sub-pixels and/or blue sub-pixels having a relatively low luminance are arranged in the second and third boundary portions BP2 and BP3, a luminance in the vicinity of the first and fourth boundary portions BP1 and BP4 may be greater than a luminance in the vicinity of the second and third boundary portions BP2 and BP3. The first to fourth boundary portions BP1, BP2, BP3, and BP4 and the arrangement of the main sub-pixels and the auxiliary sub-pixels arranged adjacent thereto are described below in detail with reference to FIGS. 12 to 15.

In the embodiments corresponding to FIG. 11, the first distance S1 and the second distance S2 may be the same as each other, or different from each other. The first distance S1 and the second distance S2 may be respectively adjusted according to a luminance difference between the first boundary portion BP1 and the second boundary portion BP2 and a luminance difference between the third boundary portion BP3 and the fourth boundary portion BP4.

Figure 13:
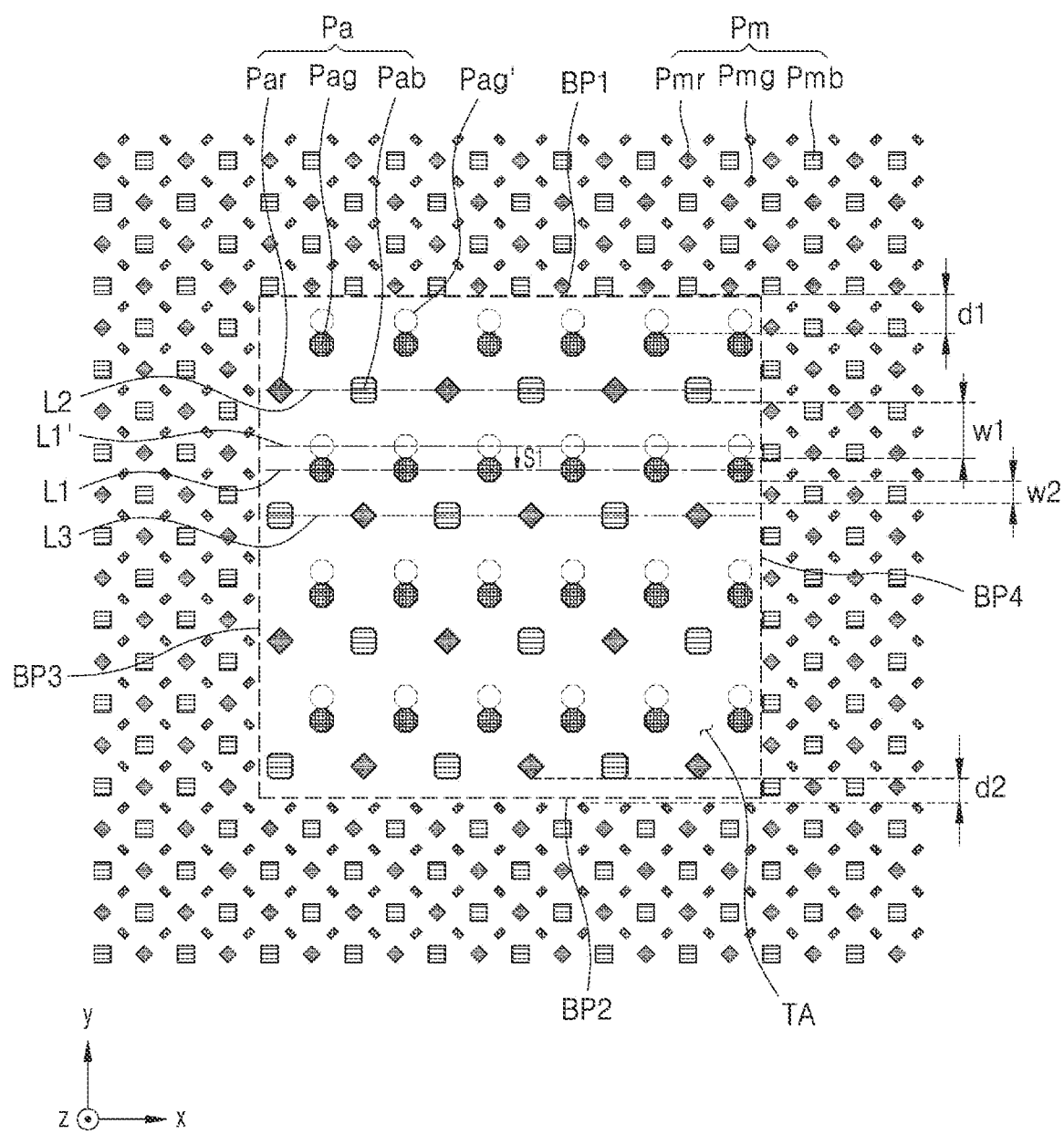

In the display apparatus according to one or more embodiments, as illustrated in FIGS. 10 and 11 described above, the whole of the auxiliary sub-pixels Pa arranged in the first area DA1 is regarded as one auxiliary sub-pixel unit PaU, and thus, the auxiliary sub-pixel unit PaU may be entirely shifted, or as illustrated in FIG. 13 to be described below, only pixels that emit light of a corresponding color included in the auxiliary sub-pixel unit PaU may be shifted.

FIGS. 12 to 15 are schematic plan views showing various pixel arrangements in a display area of a display apparatus, according to embodiments.

Figure 12:
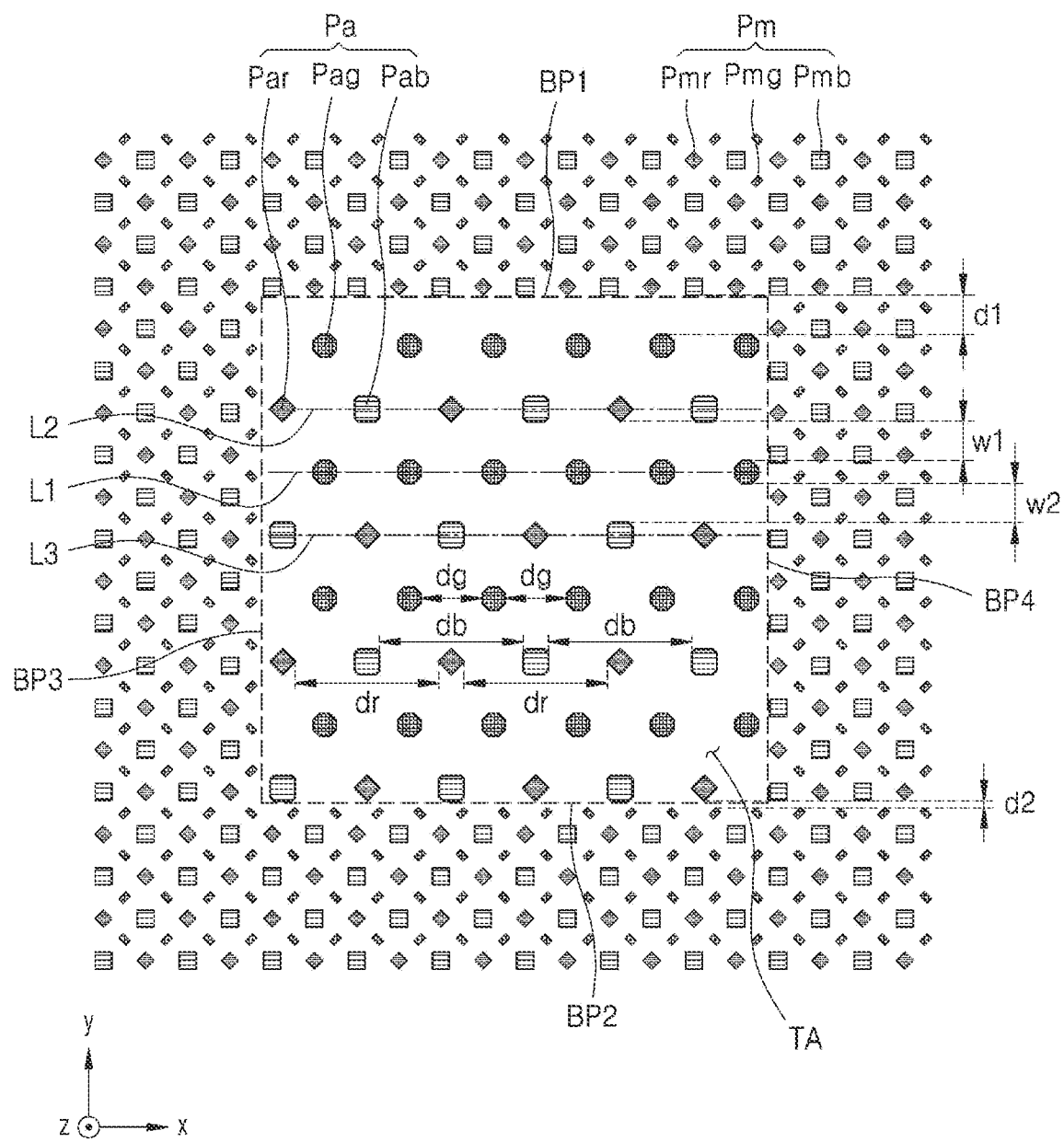
FIGS. 12 to 15 are schematic plan views showing various pixel arrangements in a display area of a display apparatus, according to embodiments.

Referring to FIG. 12, the auxiliary sub-pixels Pa arranged in the first area DA1 may be entirely shifted in the −y direction. In other words, the auxiliary sub-pixels Pa may be shifted from the first boundary portion BP1 to the second boundary portion BP2 symmetrical thereto.

In FIG. 12, as in FIG. 10 described above, as the auxiliary sub-pixels Pa are entirely shifted in the −y direction, both of first and second widths (e.g., first and second distances) w1 and w2 between respective ones of the auxiliary sub-pixels Pa in a y-axis direction may be the same. In detail, the auxiliary sub-pixels Pa may include first auxiliary pixels, for example, the second sub-pixel Pag, arranged in a virtual first line, and second auxiliary pixels, for example, the first sub-pixel Par and the third sub-pixel Pab, and third auxiliary pixels, for example, the first sub-pixel Par and the third sub-pixel Pab, the second and third auxiliary pixels being respectively arranged in virtual second and third lines L2 and L3 that are parallel to the virtual first line L1. As an example, the second auxiliary pixels, for example, the first sub-pixel Par and the third sub-pixel Pab, and third auxiliary pixels, for example, the first sub-pixel Par and the third sub-pixel Pab, may have the same pixel arrangement. In the embodiments corresponding to FIG. 12, the first to third lines L1, L2, and L3 are all illustrated as being parallel to an x-axis direction.

With respect to the first line L1, the first width w1 between the first auxiliary pixels, for example, the second sub-pixel Pag, and the second auxiliary pixels, for example, the first sub-pixel Par and the third sub-pixel Pab, which are closest to one side of the first auxiliary pixels, may be the same as the second width w2 between the first auxiliary pixels and the third auxiliary pixels, for example, the first sub-pixel Par and the third sub-pixel Pab, which are closest to the other side of the first auxiliary pixels.

As the auxiliary sub-pixels Pa are entirely shifted in the −y direction, the first interval d1 between the auxiliary sub-pixels Pa and the main sub-pixels Pm, which are arranged closest to the first boundary portion BP1, may be greater than the second interval d2 between the auxiliary sub-pixels Pa and the main sub-pixels Pm, which are arranged closest to the second boundary portion BP2.

In one or more embodiments, the auxiliary sub-pixels Pa arranged in the first area DA1 may be entirely shifted in the −y direction and the −x direction, as described above in FIG. 11.

The arrangement of the main sub-pixels Pm in the second area DA2 adjacent to first boundary portion BP1 may be the same as the arrangement of the auxiliary sub-pixels Pa in the first area DA1 adjacent in the second boundary portion BP2 that is symmetrical to the first boundary portion BP1. As illustrated in FIG. 12, the first sub-pixels Pmr that are red sub-pixels and the third sub-pixels Pmb that are blue sub-pixels are alternately arranged in the second area DA2 adjacent to the first boundary portion BP1, and the first sub-pixels Par and the third sub-pixels Pab may be alternately arranged in the first area DA1 adjacent to the second boundary portion BP2.

Furthermore, the arrangement of the main sub-pixels Pm in the second area DA2 adjacent to the third boundary portion BP3 may be the same as the arrangement of the auxiliary sub-pixels Pa in the first area DA1 adjacent to the fourth boundary portion BP4 that is symmetrical to the third boundary portion BP3. As illustrated in FIG. 12, the second sub-pixels Pmg that are green sub-pixels are arranged in the second area DA2 adjacent to the third boundary portion BP3, and the second sub-pixels Pag that are green sub-pixels may be arranged in the first area DA1 adjacent to the fourth boundary portion BP4.

Referring to FIG. 13, while the arrangement of the auxiliary sub-pixels Pa of FIG. 13 is similar to the arrangement of the auxiliary sub-pixels Pa of FIG. 12 described above, there is a difference from the embodiments corresponding to FIG. 12 in that it is not that the auxiliary sub-pixels Pa are entirely shifted, but that only the sub-pixels that emit light of a corresponding color are shifted.

In one or more embodiments, FIG. 13 illustrates that only the second sub-pixels Pag that emit green light are shifted. As a comparative example, before being shifted, a second sub-pixel Pag' may be arranged on a first line L', and the second sub-pixel Pag' may be moved by a certain distance S1 in one direction, for example, in the −y direction, and arranged on the first line L1 as illustrated in FIG. 13.

In this case, as only the first auxiliary pixels, for example, the second sub-pixels Pag, among the auxiliary sub-pixels Pa, are shifted in the −y direction, with respect to the first line L1, the first width w1 between the first auxiliary pixels, for example, the second sub-pixel Pag, and the second auxiliary pixels, for example, the first sub-pixel Par and the third sub-pixel Pab, which are closest to one side of the first auxiliary pixels, may be greater than the second width w2 between the first auxiliary pixels and the third auxiliary pixels, for example, the first sub-pixel Par and the third sub-pixel Pab, which are closest to the other side of the first auxiliary pixels.

In the embodiments corresponding to FIG. 12, as the auxiliary sub-pixels Pa are entirely shifted in the −y direction, the interval between the auxiliary sub-pixels Pa and the main sub-pixels Pm in the second boundary portion BP2 may be excessively decreased, and in this case, design according to design rules may not be easy.

Accordingly, as illustrated in FIG. 13, as only the first auxiliary pixels, for example, the second sub-pixel Pag, among the auxiliary sub-pixels Pa, are shifted in the −y direction, the second interval d2 between the auxiliary sub-pixels Pa and the main sub-pixels Pm, which are arranged closest to the second boundary portion BP2, is maintained, and the first interval d1 between the auxiliary sub-pixels Pa and the main sub-pixels Pm, which are arranged closest to the first boundary portion BP1, may be implemented to be greater than the second interval d2.

As described above, in FIG. 12 or 13, as the auxiliary sub-pixels Pa are entirely shifted or all corresponding sub-pixels are shifted, in the case of sub-pixels that emit light of the same color in the first area DA1, all intervals between the sub-pixels in one direction may be the same. As an example, for the second sub-pixel Pag that emits green light, all intervals dg (see FIG. 12) between the second sub-pixels Pag in the x-axis direction may be identical in the first area DA1. Likewise, all intervals dr (see FIG. 12) between the first sub-pixels Par in the x-axis direction may be identical, and all intervals db (see FIG. 12) between the third sub-pixels Pab in the x-axis direction may be identical. Also, respective distances may be identical in the y-axis direction or in a diagonal direction crossing an x-y axis.

Figure 14:
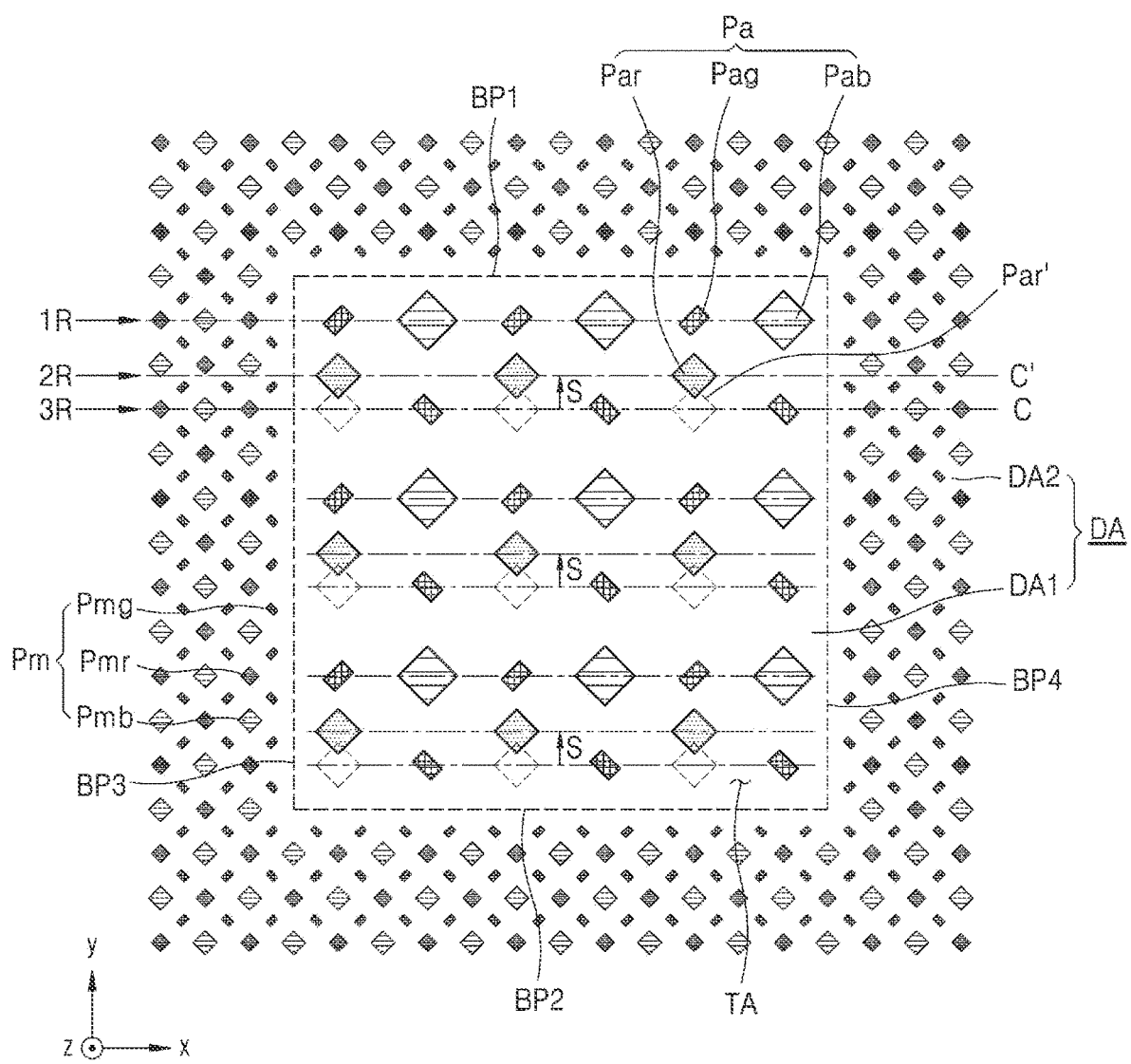

Referring to FIG. 14, the arrangement of the auxiliary sub-pixels Pa of FIG. 14 is different from the auxiliary sub-pixels Pa of FIGS. 12 and 13 described above. The auxiliary sub-pixels Pa may include the first sub-pixel Par, the second sub-pixel Pag, and the third sub-pixel Pab. In this state, the second sub-pixel Pag for emitting green light, the first sub-pixel Par for emitting red light, and the third sub-pixel Pab for emitting blue light may have sequentially decreasing luminance. In FIG. 14, the second sub-pixel Pag having the highest luminance may be arranged at the same interval in the first area DA1. In other words, in the auxiliary sub-pixels Pa closest to the first to fourth boundary portions BP1, BP2, BP3, and BP4, the second sub-pixels Pag may be arranged to have the same number and interval.

According to one or more embodiments, the second sub-pixel Pag and the third sub-pixel Pab may be alternately arranged in the first row 1R closest to the first boundary portion BP1, only the first sub-pixels Par may be arranged in a second row 2R, and only the second sub-pixels Pag may be arranged in a third row 3R. With respect to a comparative example described below, the above-described structure may be such that pixels are shifted in one direction, for example, the +y direction, by the distance S, from a reference line C on which the second sub-pixels Pag are arranged, to a new reference line C' on which the first sub-pixels Par are arranged.

As a comparative example, the first sub-pixels Par' that are not shifted by the distance S may be arranged in the same row, that is, the same line, as the second sub-pixels Pag that are arranged in the third row 3R. In this case, the luminance in the second boundary portion BP2 where the first sub-pixel Par' and the second sub-pixel Pag are alternately arranged may be greater than the luminance in the first boundary portion BP1 where the second sub-pixel Pag and the third sub-pixel Pab are alternately arranged. Accordingly, in one or more embodiments, to mitigate or reduce such a luminance difference, the first sub-pixel Par having a relatively higher luminance than the third sub-pixel Pab may be shifted in a direction, for example, the +y direction, from the second boundary portion BP2 to the first boundary portion BP1.

FIG. 14 illustrates that the first sub-pixels Par are moved only in a direction, for example, the +y direction, from the second boundary portion BP2 to the first boundary portion BP1, but the disclosure is not limited thereto. In one or more other embodiments, when the luminance in the third boundary portion BP3 is greater than the luminance in the fourth boundary portion BP4, the first sub-pixels Par may be moved in a direction, for example, the +x direction, from the third boundary portion BP3 to the fourth boundary portion BP4.

Figure 15:
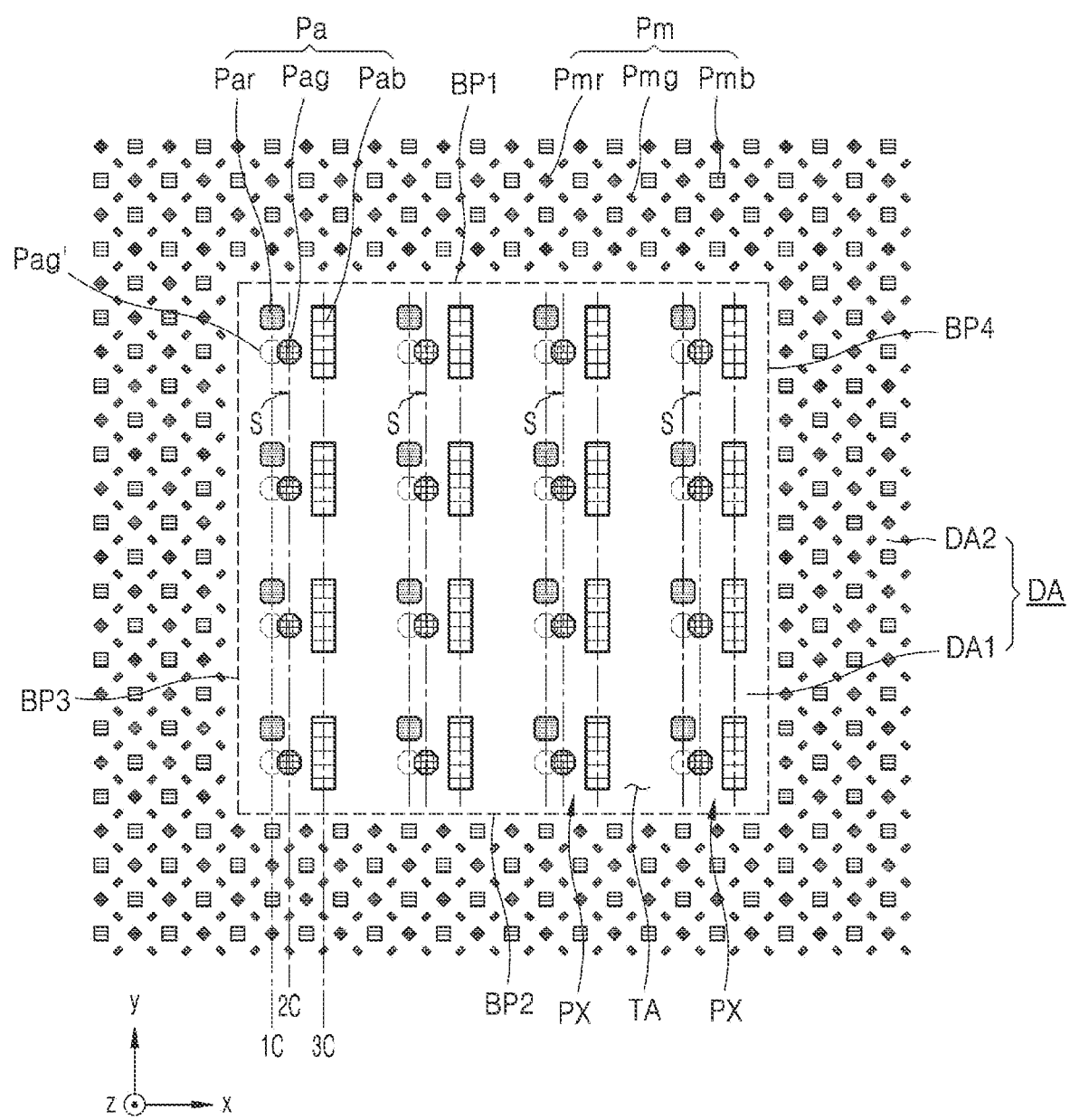

Referring to FIG. 15, the arrangement of the auxiliary sub-pixels Pa of FIG. 14 is different from the arrangement of the auxiliary sub-pixels Pa of FIGS. 12 to 14 described above. In FIG. 15, the auxiliary sub-pixels Pa, as one pixel unit PX, may include the first sub-pixel Par, the second sub-pixel Pag, and the third sub-pixel Pab, and the pixel unit PX may be arranged to have a constant interval in the first area DA1.

According to one or more embodiments, the first sub-pixels Par may be arranged in a first column 1C, which is closest to the third boundary portion BP3, the second sub-pixels Pag may be arranged in a second column 2C, and the third sub-pixels Pab may be arranged in a third column 3C. With respect to a comparative example described below, the above-described structure may be such that pixels are shifted in one direction, for example, the +x direction, by a certain distance S, from a reference line C on which the first sub-pixels Par and the second sub-pixels Pag' are arranged, to a new reference line C' on which the second sub-pixels Pag are arranged.

As a comparative example, the second sub-pixels Pag' that are not shifted by the distance S may be arranged in the same row, that is, the same line, as the first sub-pixels Par that are arranged in the first column 1C. In this case, the luminance in the third boundary portion BP3 where the first sub-pixel Par and the second sub-pixel Pag' are alternately arranged may be greater than the luminance in the fourth boundary portion BP4 where the third sub-pixel Pab are arranged. Accordingly, in one or more embodiments, to mitigate or reduce such a luminance difference, the second sub-pixel Pag, which has a relatively higher luminance than the third sub-pixel Pab, may be shifted in a direction, for example, the +x direction, from the third boundary portion BP3 toward the fourth boundary portion BP4.

FIG. 15 illustrates that only the second sub-pixels Pag are moved in a direction, for example, in the +x direction, from the third boundary portion BP3 toward the fourth boundary portion BP4, but the disclosure is not limited thereto. In one or more other embodiments, like the second sub-pixels Pag, the first sub-pixels Par may also move in a direction, for example, in the +x direction, from the third boundary portion BP3 toward the fourth boundary portion BP4. In this case, for example, a distance covered by the first sub-pixels Par may be less than a distance covered by the second sub-pixels Pag.

As described above, the arrangements of the auxiliary sub-pixels Pa described with reference to FIGS. 10 to 15 are merely examples, and the disclosure is not limited thereto. The auxiliary sub-pixels Pa of the display apparatus according to the present disclosure may have various arrangements in addition to the arrangements of FIGS. 10 to 15.

Although the above description focuses on a display apparatus, the disclosure is not limited thereto. For example, a method of manufacturing the above display apparatus may belong to the scope of the present disclosure.

According to the above-described embodiments of the disclosure, display apparatuses having an extended display area to display an image even in an area where components that are electronic elements are arranged may be implemented. The scope of the present disclosure is not limited by the above effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
    a substrate comprising a first area and a second area;
    auxiliary pixels in the first area, and comprising:
        first auxiliary pixels, respective ones of which being along a first line; and
        second auxiliary pixels, respective ones of which being arranged along a second line that is parallel to the first line; and
        third auxiliary pixels, respective ones of which being arranged along a third line that is parallel to the first line, and having a same pixel arrangement as the second auxiliary pixels;
    main pixels in the second area; and
    a transmissive portion between the auxiliary pixels,
    wherein a first distance between the first line and the second line at one side of the first line is less than a second distance between the first line and the third line at an other side of the first line.

2. The display apparatus of claim 1, wherein, per unit area, a luminance of the first auxiliary pixels is greater than a luminance of the second auxiliary pixels or the third auxiliary pixels.

3. The display apparatus of claim 1, wherein the first auxiliary pixels comprise second sub-pixels for emitting green light.

4. The display apparatus of claim 3, wherein the second auxiliary pixels and the third auxiliary pixels comprise first sub-pixels for emitting red light and third sub-pixels for emitting blue light.

5. The display apparatus of claim 4, wherein the first area is in contact with the second area, and comprises a first boundary portion and a second boundary portion that are substantially symmetrical and substantially parallel to each other, and
    wherein a first interval between corresponding ones of the main pixels and corresponding ones of the second auxiliary pixels that are closest to the first boundary portion is different from a second interval between corresponding ones of the main pixels and corresponding ones of the first auxiliary pixels that are closest to the second boundary portion.

6. The display apparatus of claim 5, wherein the first interval is greater than the second interval.

7. The display apparatus of claim 1, wherein the transmissive portion is between sub-pixels that are configured to emit light of a same wavelength among the auxiliary pixels.

8. The display apparatus of claim 1, wherein intervals in a first direction between sub-pixels that are configured to emit light of a same wavelength among the auxiliary pixels are substantially equal.

9. A display apparatus comprising:
    a substrate comprising a first area and a second area;
    auxiliary pixels in the first area;
    main pixels in the second area;
    a transmissive portion between the auxiliary pixels; and
    a first boundary portion and a second boundary portion, which are substantially symmetrical and substantially parallel to each other, as respective boundary portions contacting the first area and the second area,
    wherein a first interval between respective ones of the main pixels and respective ones of auxiliary pixels that are closest to the first boundary portion is different from a second interval between others of the main pixels and others of the auxiliary pixels that are closest to the second boundary portion.

10. The display apparatus of claim 1, wherein the auxiliary pixels are in n rows and m columns, and are entirely shifted in the second area in a first direction from a first row toward an n-th row, and/or in a second direction from a first column toward an m-th column.

11. The display apparatus of claim 10, wherein a distance in which the auxiliary pixels are shifted in the first direction is different from a distance in which the auxiliary pixels are shifted in the second direction.

12. The display apparatus of claim 10, wherein the auxiliary pixels comprise first auxiliary pixels in the first row and second auxiliary pixels in the n-th row, and
    wherein the first auxiliary pixels and the second auxiliary pixels are configured to emit light of different wavelengths.

13. The display apparatus of claim 12, wherein the first auxiliary pixels are configured to emit green light, and the second auxiliary pixels are configured to emit blue or red light.

14. The display apparatus of claim 9, wherein the first interval is greater than the second interval.

15. A display apparatus comprising:
    a substrate comprising a first area and a second area;
    auxiliary pixels in the first area and comprising first sub-pixels, second sub-pixels, and third sub-pixels, the first sub-pixels, the second sub-pixels, and the third sub-pixels configured to respectively emit light of different wavelengths;
    main pixels in the second area;
    a transmissive portion between the auxiliary pixels; and
    a first boundary portion and a second boundary portion that are substantially symmetrical and substantially parallel to each other, and contacting the first area and the second area,
    wherein, per unit area, a luminance of the second sub-pixels is greater than a luminance of the first sub-pixels and the third sub-pixels, and
    wherein, in the first area, the first sub-pixels are shifted in a first direction from the second boundary portion to the first boundary portion.

16. The display apparatus of claim 15, wherein the first sub-pixels and the second sub-pixels are alternately arranged in the second boundary portion, and
    wherein the second sub-pixels and the third sub-pixels are alternately arranged in the first boundary portion.

17. The display apparatus of claim 15, wherein the second sub-pixels are configured to emit green light.

18. The display apparatus of claim 17, wherein the first sub-pixels are configured to emit red light, and the third sub-pixels are configured emit blue light.

19. The display apparatus of claim 15, wherein an arrangement of respective ones of the main pixels closest to the first boundary portion is the same as an arrangement of respective ones of the auxiliary pixels closest to the second boundary portion.

* * * * *